(12) United States Patent
Xu et al.

(10) Patent No.: US 12,057,612 B2
(45) Date of Patent: *Aug. 6, 2024

(54) WAVEGUIDE INCLUDING A SUBSTRATE HAVING A COPLANAR WAVEGUIDE AND A SUPERCONDUCTING MATERIAL COMPENSATING STRUCTURE FORMED THEREON AND USABLE IN A QUANTUM PROCESSOR

(71) Applicant: ALIBABA GROUP HOLDING LIMITED, Grand Cayman (KY)

(72) Inventors: Hua Xu, Hangzhou (CN); Jin Qin, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 18/299,181

(22) Filed: Apr. 12, 2023

(65) Prior Publication Data

US 2023/0253692 A1    Aug. 10, 2023

Related U.S. Application Data

(63) Continuation of application No. 17/319,870, filed on May 13, 2021, now Pat. No. 11,658,373.

(30) Foreign Application Priority Data

May 13, 2020    (CN) .......................... 202010403384.7

(51) Int. Cl.
*H01P 3/00*    (2006.01)
*H05K 1/02*    (2006.01)
(Continued)

(52) U.S. Cl.
CPC ............ *H01P 3/003* (2013.01); *H05K 1/0237* (2013.01); *G06N 10/00* (2019.01); *H01P 11/003* (2013.01)

(58) Field of Classification Search
CPC ......... H01P 3/003; H01P 3/006; H01P 11/003
(Continued)

(56) References Cited

U.S. PATENT DOCUMENTS

| 5,194,833 A | 3/1993 | Dougherty et al. |
| 7,381,583 B1 | 6/2008 | Ebel et al. |

(Continued)

FOREIGN PATENT DOCUMENTS

| CN | 102107848 A | 6/2011 |
| GB | 2412008 A | 9/2006 |
| TW | 201626012 A | 7/2016 |

OTHER PUBLICATIONS

Chinese Search Report issued in corresponding Chinese Application No. 202010403384.7 on Jul. 29, 2023 (1 page).

*Primary Examiner* — Benny T Lee
(74) *Attorney, Agent, or Firm* — Finnegan, Henderson, Farabow, Garrett & Dunner, LLP

(57) ABSTRACT

A waveguide includes: a substrate; a first ground wire; a second ground wire; a signal wire; and a compensation structure. The first ground wire, the second ground wire, and the signal wire are disposed on the substrate at intervals, and the signal wire is located between the first ground wire and the second ground wire. The compensation structure is configured to contact at least one of the substrate, the first ground wire, the second ground wire, or the signal wire; and the compensation structure comprises a superconducting material.

20 Claims, 29 Drawing Sheets

(51) Int. Cl.
*G06N 10/00* (2022.01)
*H01P 11/00* (2006.01)

(58) Field of Classification Search
USPC .................................................. 333/238, 246
See application file for complete search history.

(56) References Cited

U.S. PATENT DOCUMENTS

| | | | |
|---|---|---|---|
| 11,658,373 B2* | 5/2023 | Xu et al. ................. | H01P 3/003 333/239 |
| 2010/0079222 A1 | 4/2010 | Makita | |
| 2017/0062898 A1 | 3/2017 | Chang et al. | |
| 2018/0069288 A1 | 3/2018 | Minev et al. | |
| 2018/0131066 A1 | 5/2018 | Laighton et al. | |

* cited by examiner

WAVEGUIDE INCLUDING A SUBSTRATE HAVING A COPLANAR WAVEGUIDE AND A SUPERCONDUCTING MATERIAL COMPENSATING STRUCTURE FORMED THEREON AND USABLE IN A QUANTUM PROCESSOR

CROSS-REFERENCE TO RELATED APPLICATIONS

The present application claims the benefit of and is a continuation of U.S. application Ser. No. 17/319,870, filed on May 13, 2021, issued as U.S. Pat. No. 11,658,373, on May 23, 2023, which claims priority to Chinese Application 202010403384.7, filed on May 13, 2020, the content of all of which is incorporated herein by reference in their entireties.

TECHNICAL FIELD

The present disclosure relates to the field of quantum chips, and in particular, to a packaging structure, a manufacturing method of a packaging structure, and a quantum processor.

BACKGROUND

In the field of superconducting quantum computing chips, three-dimensional (3D) integration based on an air bridge is a conventional solution for preparing a superconducting packaging structure. Typically, a suspended air bridge of an arched structure is processed at two ends of a coplanar waveguide (CPW) by a photoresist hot-melt method and a photoresist removal process so as to connect ground wires at the two ends, thereby realizing 3D integration solution for the superconducting packaging structure. The 3D integration based on an air bridge can enable developing a 3D wiring structure on a planar chip to improve the integration of multiple quantum bits. In addition, the signal crosstalk between a high-order mode of the CPW and multiple bits can also be suppressed, thereby improving the signal-to-noise ratio of a device.

However, the introduction of air bridges increases energy loss, which can reduce the internal quality factor (Qi) value of the CPW, thereby affecting the performance of the entire packaging structure. Based on the theoretical and experimental analysis, the loss comes from dielectric loss attached to the surface of the air bridge. Processing and shaping the air bridge requires hot-melt deformation of photoresist, which may leave a dielectric layer that is difficult to remove on the surface of the air bridge. Therefore, the resulting dielectric loss of the processed air bridge can be high.

Existing technologies generally reduce the impact on CPW Qi by adjusting the height, size, and process of the air bridge itself. However, no known solutions have been found to reduce dielectric loss to reduce the impact on Qi.

SUMMARY OF THE DISCLOSURE

Embodiments of the present disclosure provide a packaging structure, a manufacturing method of a packaging structure, and a quantum processor.

In an aspect, a packaging structure includes a substrate; a coplanar waveguide including a first ground wire, a second ground wire, and a signal wire, wherein the first ground wire, the second ground wire, and the signal wire are disposed on a surface of the substrate at intervals, and the signal wire is located between the first ground wire and the second ground wire; an air bridge including a first end connected with the first ground wire and a second end connected with the second ground wire, wherein a gap exists between the air bridge and a surface of the signal wire away from the substrate; and a compensation structure located on the surface of the substrate.

In another aspect, a packaging structure includes a substrate; a coplanar waveguide including a first ground wire, a second ground wire, and a signal wire, wherein the first ground wire, the second ground wire, and the signal wire are disposed on a surface of the substrate at intervals, and the signal wire is located between the first ground wire and the second ground wire; an air bridge including a first end connected with the first ground wire and a second end connected with the second ground wire, wherein a gap exists between the air bridge and a surface of the signal wire away from the substrate; and a compensation structure located on a surface of the coplanar waveguide.

In yet another aspect, a packaging structure includes a substrate; a coplanar waveguide including a first ground wire, a second ground wire, and a signal wire, wherein the first ground wire, the second ground wire, and the signal wire are disposed on a surface of the substrate at intervals, and the signal wire is located between the first ground wire and the second ground wire; an air bridge including a first end connected with the first ground wire and a second end connected with the second ground wire, wherein a gap exists between the air bridge and a surface of the signal wire away from the substrate; and a compensation structure located on a surface of the air bridge.

In yet another aspect, a method of manufacturing a packaging structure includes providing a substrate; and forming a coplanar waveguide, a compensation structure, and an air bridge on a surface of the substrate to form a packaging structure, wherein the coplanar waveguide includes a first ground wire, a second ground wire, and a signal wire, wherein the first ground wire, the second ground wire, and the signal wire are disposed on a surface of the substrate at intervals, and the signal wire is located between the first ground wire and the second ground wire; the air bridge includes a first end connected with the first ground wire and a second end connected with the second ground wire, wherein a gap exists between the air bridge and a surface of the signal wire away from the substrate; and the compensation structure is located on at least one of the surface of the substrate, a surface of the coplanar waveguide, or a surface of the air bridge.

In yet another aspect, a quantum processor includes a packaging structure, and the packaging structure includes a substrate; a coplanar waveguide including a first ground wire, a second ground wire, and a signal wire, wherein the first ground wire, the second ground wire, and the signal wire are disposed on a surface of the substrate at intervals, and the signal wire is located between the first ground wire and the second ground wire; an air bridge including a first end connected with the first ground wire and a second end connected with the second ground wire, wherein a gap exists between the air bridge and a surface of the signal wire away from the substrate; and a compensation structure located on at least one of the surface of the substrate, a surface of the coplanar waveguide, or a surface of the air bridge.

In yet another aspect, a quantum processor includes a packaging structure, and the packaging structure is manufactured by a method. The method includes providing a substrate; and forming a coplanar waveguide, a compensation structure, and an air bridge on a surface of the substrate to form a packaging structure, wherein the coplanar waveguide includes a first ground wire, a second ground wire, and a signal wire, wherein the first ground wire, the second ground wire, and the signal wire are disposed on a surface of the substrate at intervals, and the signal wire is located between the first ground wire and the second ground wire; the air bridge includes a first end connected with the first ground wire and a second end connected with the second ground wire, wherein a gap exists between the air bridge and a surface of the signal wire away from the substrate; and the compensation structure is located on at least one of the surface of the substrate, a surface of the coplanar waveguide, or a surface of the air bridge.

BRIEF DESCRIPTION OF THE DRAWINGS

The drawings described here are used to provide a further understanding of the present disclosure, where like features are denoted by the same reference labels throughout the detailed description of the drawings. Example embodiments of the present disclosure and description thereof are used to explain the present disclosure, and do not constitute an improper limitation to the present disclosure.

DETAILED DESCRIPTION OF THE DISCLOSURE

Figure 1:
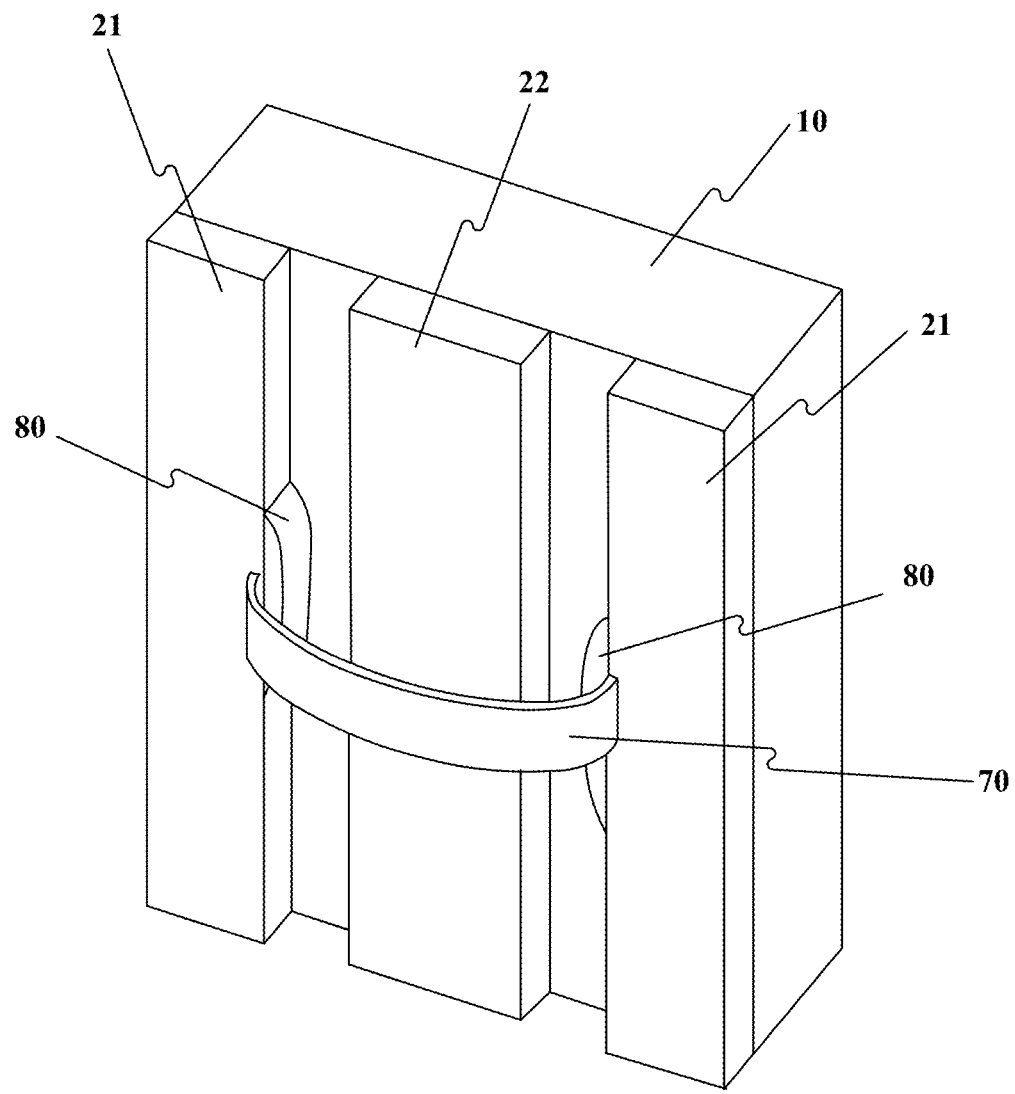
FIG. 1 illustrates a schematic structural diagram of an example packaging structure, consistent with some embodiments of this disclosure.

Technical solutions disclosed in the embodiments of the present disclosure can be described with reference to the accompanying drawings in the embodiments of the present disclosure. It is apparent that the described embodiments are merely some of, rather than all, the embodiments of the present disclosure. Based on the embodiments of the present disclosure, all other embodiments derived by those of ordinary skill in the art without creative efforts fall within the protection scope of the present disclosure.

The terms used in the embodiments of the present disclosure are for the purpose of describing particular embodiments only, and are not intended to limit the present disclosure. The singular forms "a," "said," and "the" used in the embodiments of the present disclosure and the appended claims are also intended to include plural forms, unless other meanings are clearly indicated in the context. "Plurality" includes at least two. In addition, references to "one embodiment" are not intended to be interpreted as excluding the existence of additional embodiments that also incorporate the recited features. It should be noted that, the relational terms herein such as "first" and "second" are used only to differentiate an entity or operation from another entity or operation, and do not require or imply any actual relationship or sequence between these entities or operations. It should be understood that the data used in this way can be interchanged under appropriate circumstances so that the embodiments of the present disclosure described herein can be implemented in an order other than those illustrated or described herein.

It should be understood that the term "and/or" used herein is only an association relationship describing associated objects, which means that there can be three relationships. For example, A and/or B can mean three cases that A exists alone, both A and B exist, and B exists alone. In addition, the character "/" herein generally means that the associated objects before and after it are in an "or" relationship. As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

Depending on the context, the words "if" and "supposing" as used herein can be interpreted as "at the time of" or "when" or "in response to determination" or "in response to detection." Similarly, depending on the context, the phrase "if determined" or "if detected (stated condition or event)" can be interpreted as "when determined" or "in response to determination" or "when detected (stated condition or event)" or "in response to detection (stated condition or event)."

Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. In the absence of more limitations, an element defined by "including a/an . . . " does not exclude that the commodity or system including the element further has other identical elements. As another example, a process, method, system, product, or device that includes a series of steps or units is not necessarily limited to the clearly listed steps or units, and can include other steps or units that are not clearly listed or are inherent to the process, method, product, or device.

Figure 2A:
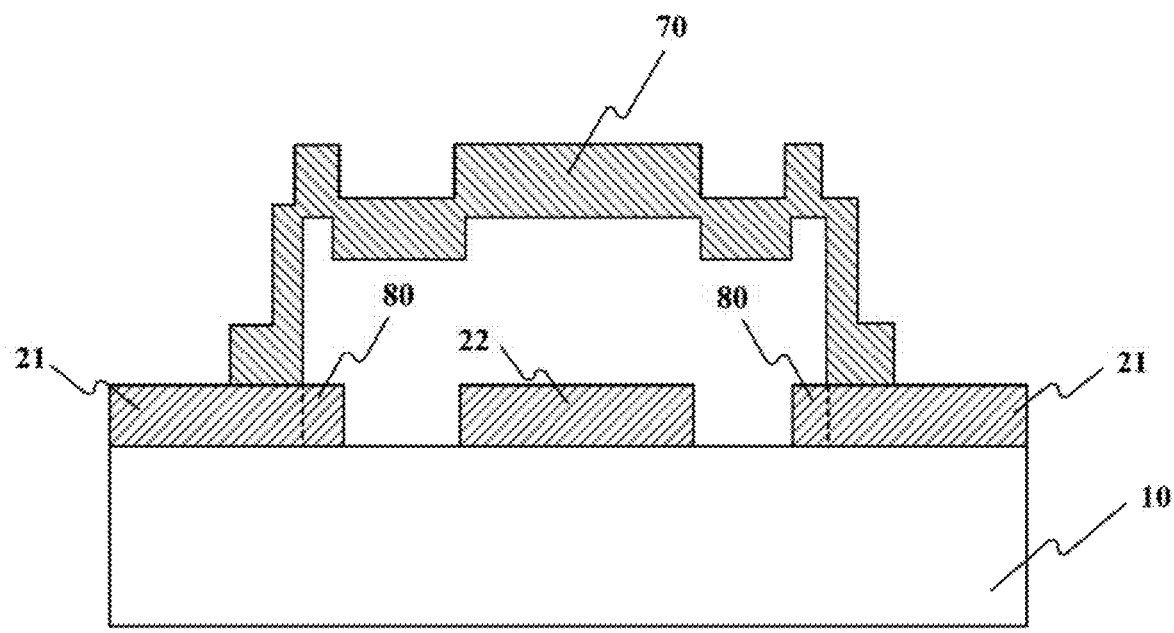
FIGS. 2A-2D respectively illustrate schematic structural diagrams of four example packaging structures, consistent with some embodiments of this disclosure.

Consistent with some embodiments of this disclosure, FIG. 1 illustrates a schematic structural diagram of an example packaging structure 100. FIG. 2A illustrates a schematic structural diagram of an example packaging structure 200A. As illustrated in FIGS. 1 and 2A, packaging structure 100 (FIG. 1) and packaging structure 200A (FIG.

2A) include a substrate 10 and a coplanar waveguide (CPW). The coplanar waveguide includes two ground wires 21 and a signal wire 22. The ground wires 21 and signal wire 22 are disposed on a surface of substrate 10 at intervals, in which signal wire 22 is located between the two ground wires 21. Packaging structure 100 and packaging structure 200A also include an air bridge 70, including a first end and a second end. The first end of air bridge 70 is connected with one of ground wires 21, and the second end of air bridge 70 is connected with the other one of ground wires 21, in which a gap exists between air bridge 70 and a surface of signal wire 22 and is away from substrate 10.

As illustrated in FIG. 1, packaging structure 100 further includes at least one compensation structure 80 that is located on the surface of substrate 10 in a contact mode. In some embodiments, the at least one compensation structure 80 can be located on a surface of a coplanar waveguide (e.g., similar to the coplanar waveguide that includes ground wires 21 and signal wire 22 as illustrated in FIG. 1) in a contact mode, which is not illustrated in FIG. 1. In some embodiments, the at least one compensation structure 80 can be located on the surface of an air bridge (e.g., similar to air bridge 70 in FIG. 1) in a contact mode, which is not illustrated in FIG. 1.

In packaging structure 100 and packaging structure 200A, the integration of multi-dimensional quantum bits is realized by air bridge 70. When the coplanar waveguide structure transmits signals, the introduction of air bridge 70 can be equivalent to at least one of a capacitor or inductor structure. Typically, a part of electromagnetic field energy can be shared from signal wire 22. Such a part of energy can be directly grounded, thus introducing an energy loss. When signals are transmitted to air bridge 70, compensation structure 80 can produce a strong local electromagnetic field between signal wire 22 and ground wires 21, thereby reducing the electromagnetic loss caused from the surface of air bridge 70. That is, compared with a packaging structure without a compensation structure, packaging structure 100 or packaging structure 200 can reduce the energy loss and also reduce the decrease in the internal quality factor (Qi) of the coplanar waveguide, and packaging structure 100 or packaging structure 200A can achieve a relatively good performance.

Figure 3A:
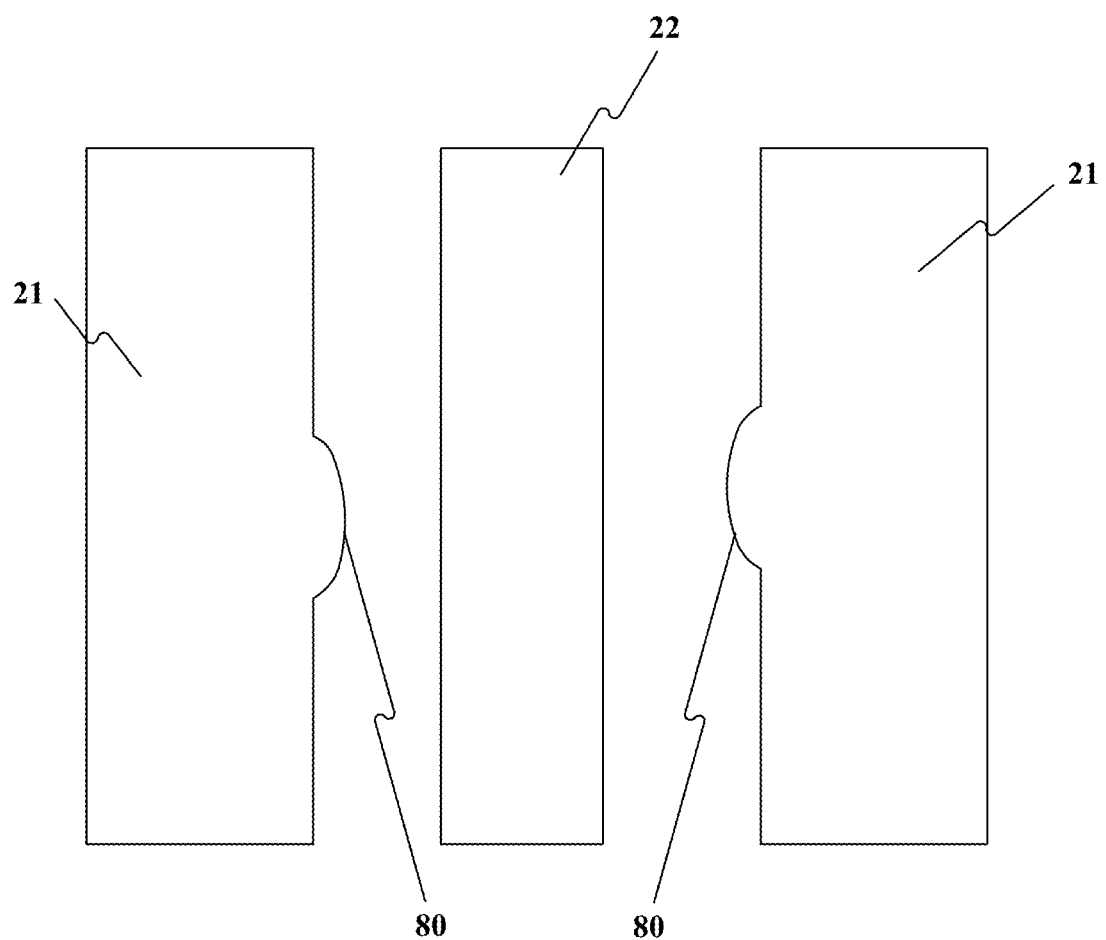
FIGS. 3A-3D respectively illustrate schematic partial structural diagrams of four example packaging structures, consistent with some embodiments of this disclosure.
Figure 3B:
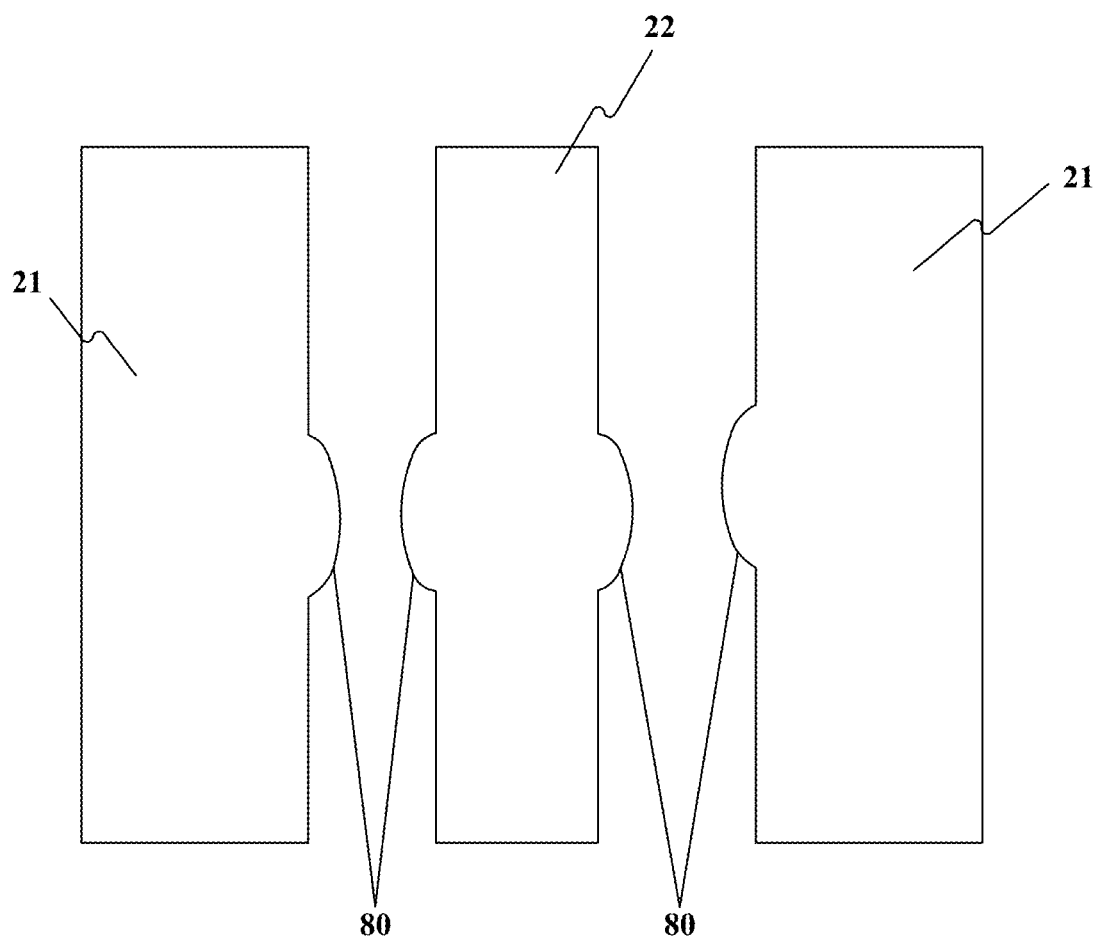
Figure 3C:
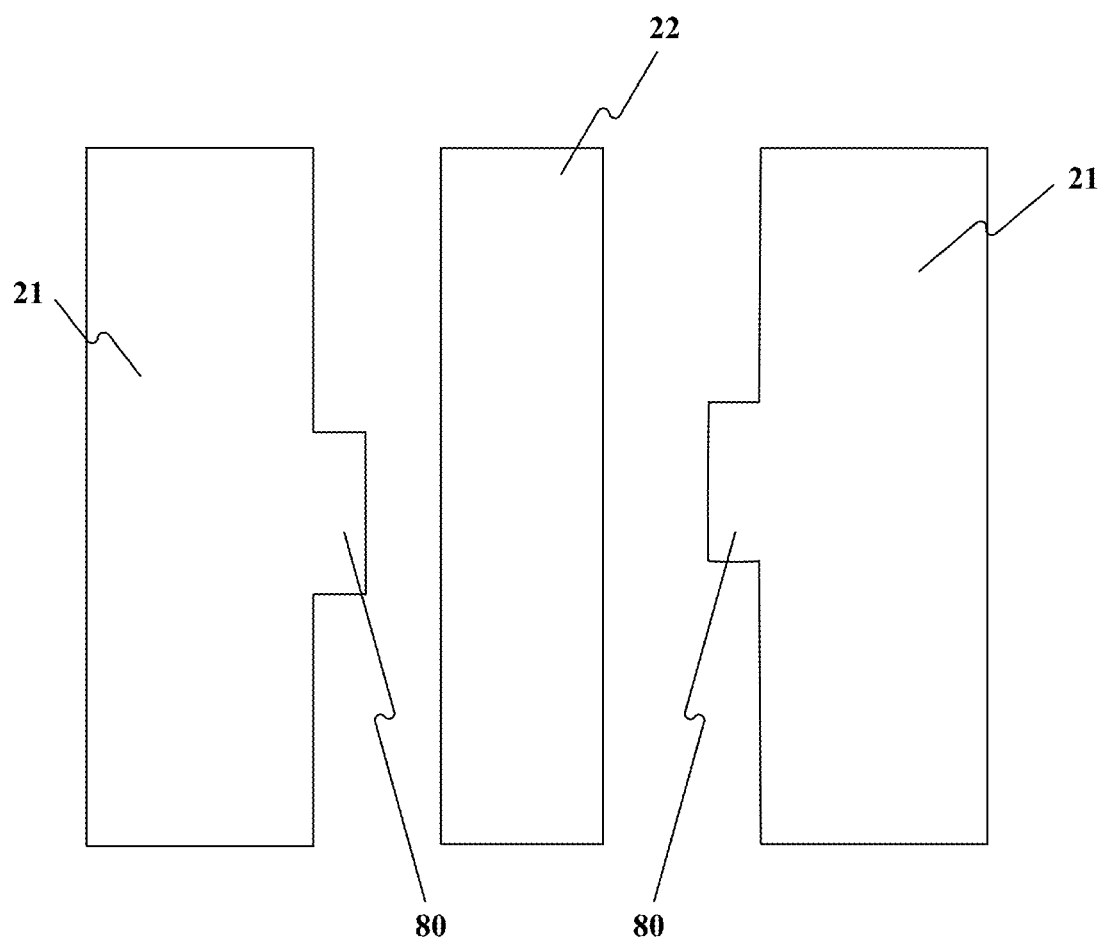

Consistent with some embodiments of this disclosure, FIGS. 3A-3C respectively illustrate schematic partial structural diagrams of three example packaging structures. As illustrated in FIGS. 1 and 3A-3C, compensation structure 80 can be located on side walls of ground wires 21, on a side wall of signal wire 22, or on side walls of both ground wires 21 and signal wire 22. By doing so, compensation structure 80 and the coplanar waveguide can be manufactured synchronously in a manufacturing process, which can further improve the manufacturing efficiency of the packaging structure and reduce the manufacturing process difficulty of the packaging structure.

By way of example, in FIG. 1, packaging structure 100 includes two compensation structures 80 that are located on side walls of ground wires 21. In FIG. 2A, packaging structure 200A includes two compensation structures 80 that are also located on side walls of ground wires 21. In FIG. 3A, a packaging structure 300A includes two compensation structures 80 that are respectively disposed on a side wall of one of ground wires 21. In FIG. 3B, a packaging structure 300B includes four compensation structures 80. Two of the four compensation structures 80 are respectively disposed on a side wall of one of ground wires 21, and the other two of the four compensation structures 80 are respectively disposed on two side walls of signal wire 22. In FIG. 3C, a packaging structure 300C includes two compensation structures 80 that are respectively disposed on a side wall of one of ground wires 21 and have a shape different from the shape of compensation structures 80 in packaging structure 300A or packaging structure 300B.

Figure 3D:
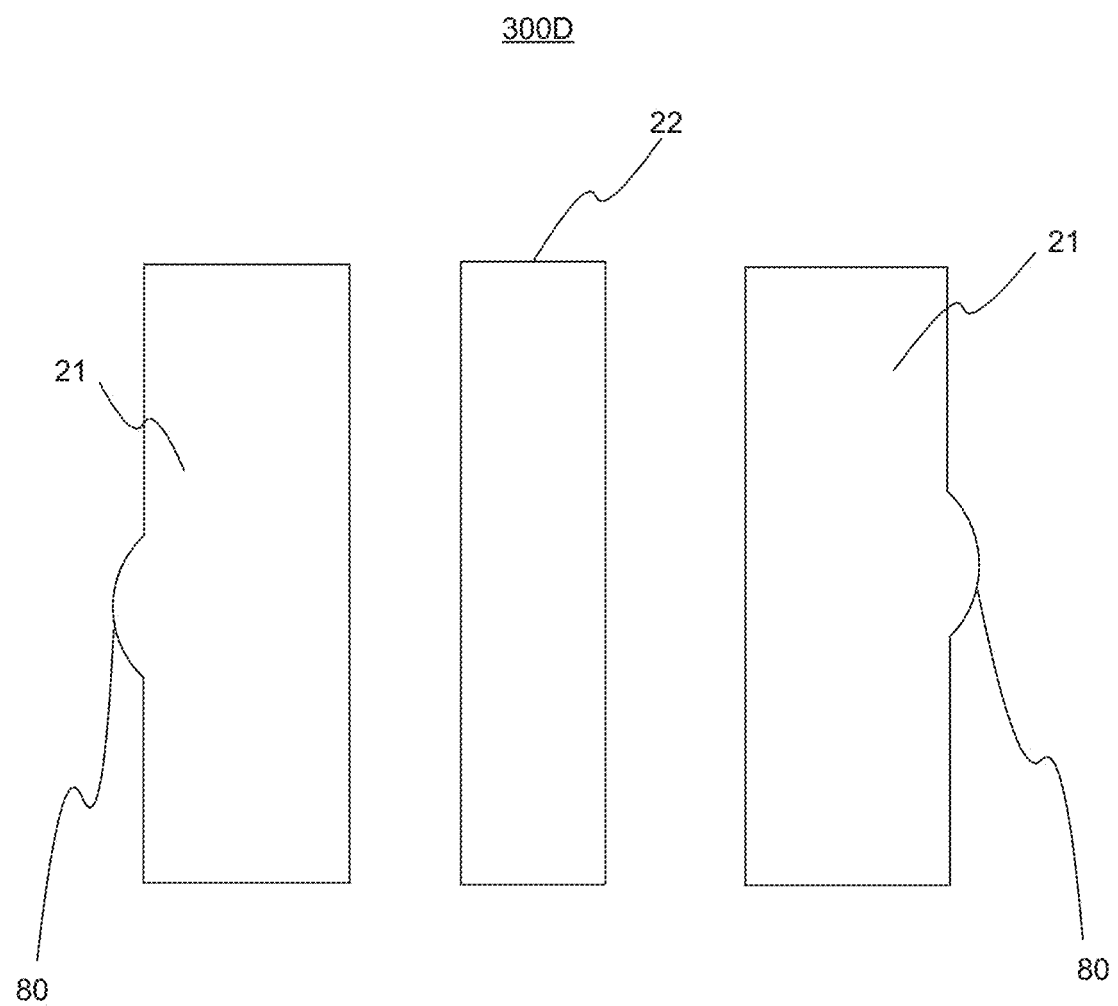

In some embodiments, to reduce the dielectric loss, as illustrated in FIGS. 1 and 3A-3C, compensation structure(s) 80 can be located in a gap between signal wire 22 and at least one of ground wires 21. In some embodiments, as illustrated in FIG. 3D, the compensation structures 80 in the packaging structure 300D can be located on at least one side wall of the ground wires 21 but not between the signal wire 22 and at least one of the ground wires 21. It should be noted that the shape of the compensation structure in this disclosure can be configured to be any shape. For example, it can be a cube, a hemisphere, a half cylinder, an ellipsoid, a cylinder, a prism, a polyhedron, or any other regular or irregular shapes. The compensation structure can be configured to be any suitable shape in accordance with application situations.

Consistent with some embodiments of this disclosure, electromagnetic simulations of different chips can be performed using a finite-element analysis (FEA) software (e.g., COMSOL®). For example, three different situations can be simulated. The first simulation can correspond to a scenario that there is no air bridge on the coplanar waveguide. The second simulation can correspond to a scenario that a single air bridge is added to the coplanar waveguide. The third simulation can correspond to a scenario that a single air bridge is added to the coplanar waveguide, in which compensation structure 80 is added to a corresponding center position, such as illustrated in FIG. 1.

Figure 4A:
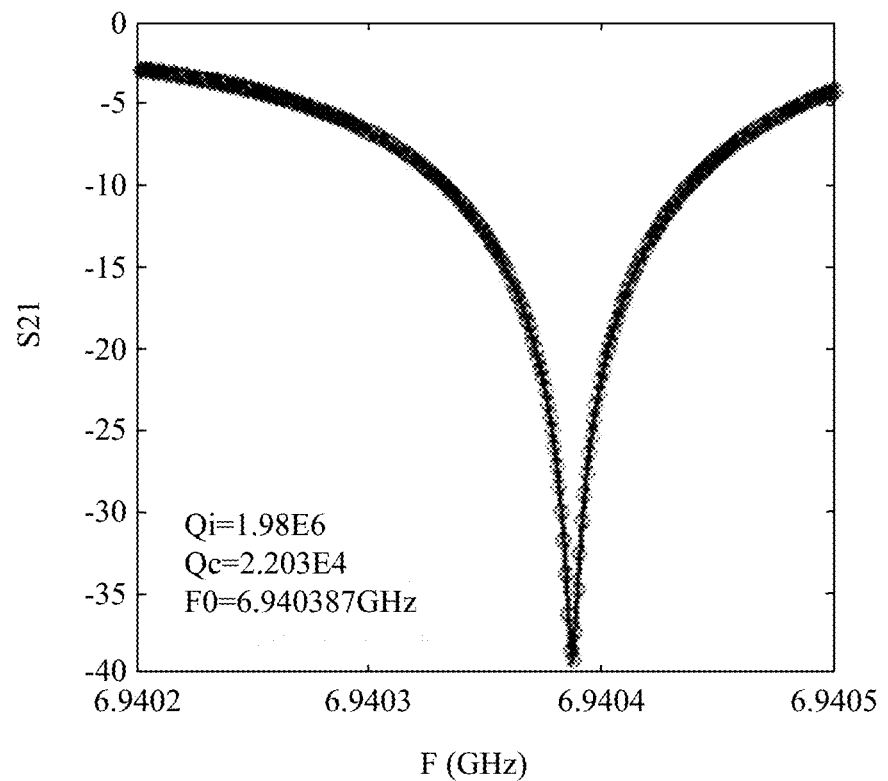
FIGS. 4A-4C are respective simulation results obtained by simulating several example packaging structures, consistent with some embodiments of this disclosure.
Figure 4B:
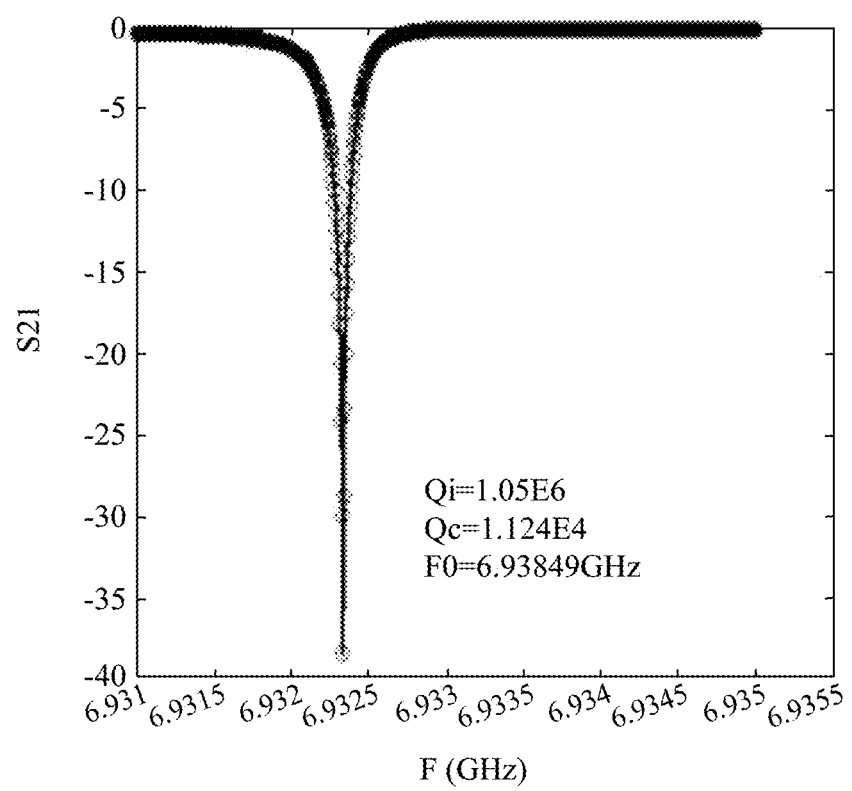
Figure 4C:
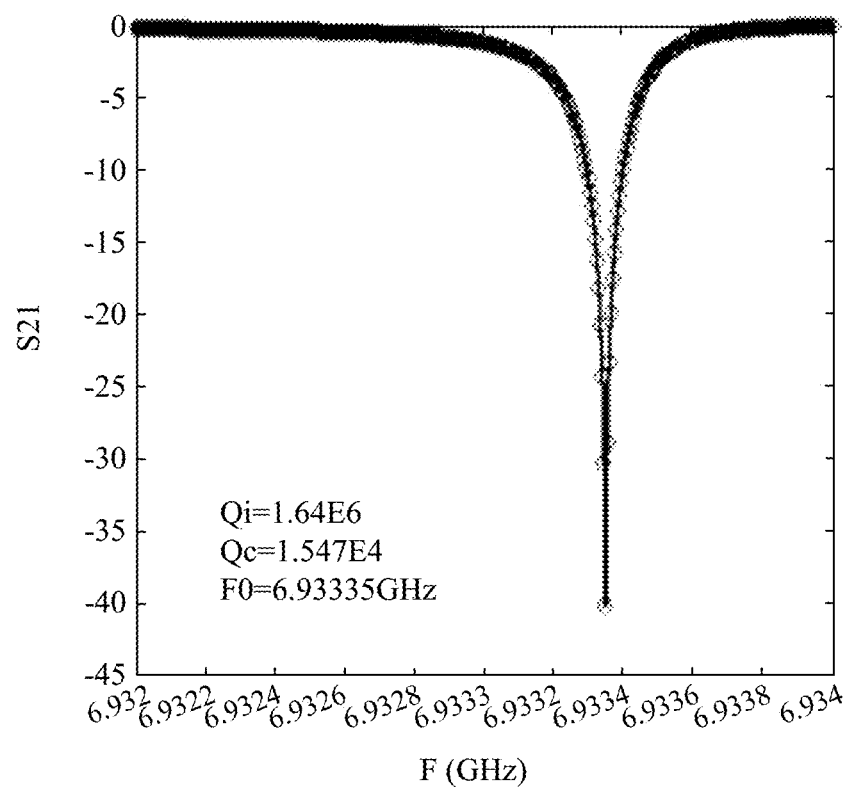
Figure 4D:
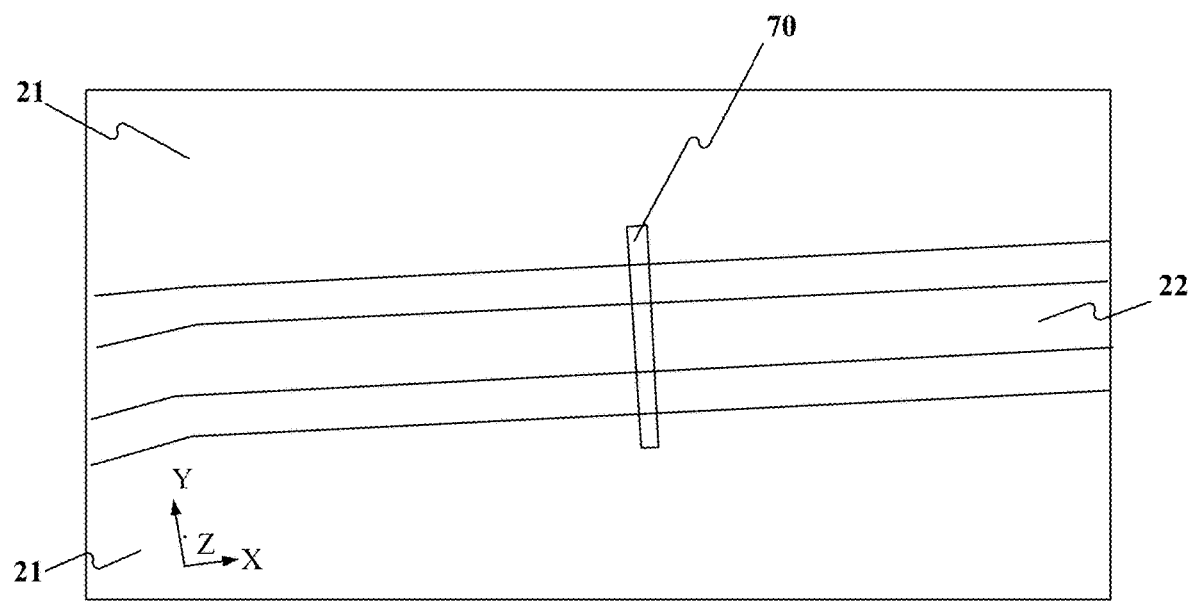
FIGS. 4D and 4E respectively illustrate a sketch drawing and a three-dimensional (3D) drawing of an example packaging structure in a finite-element analysis (FEA) software, consistent with some embodiments of this disclosure.
Figure 4E:
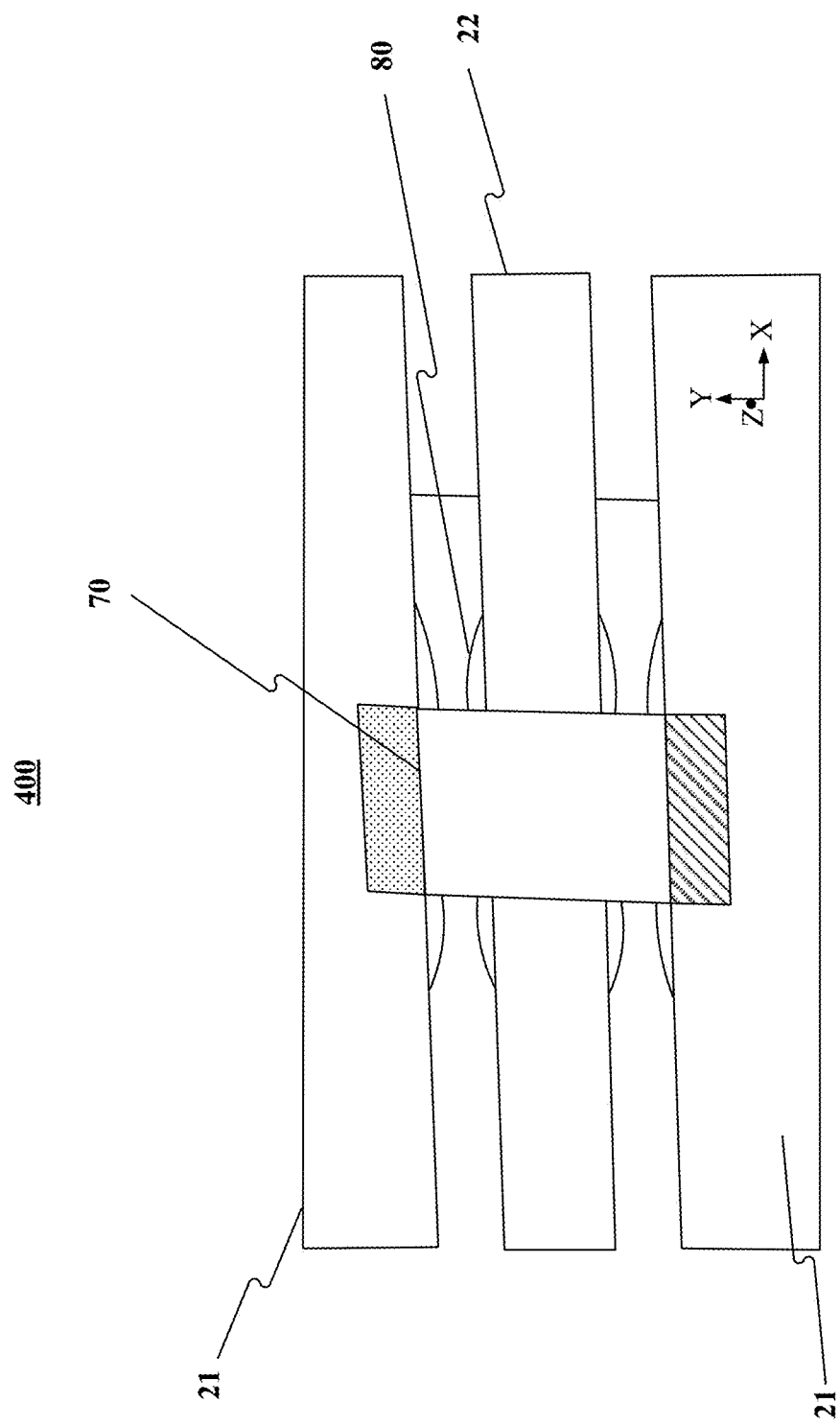
Figure 4F:
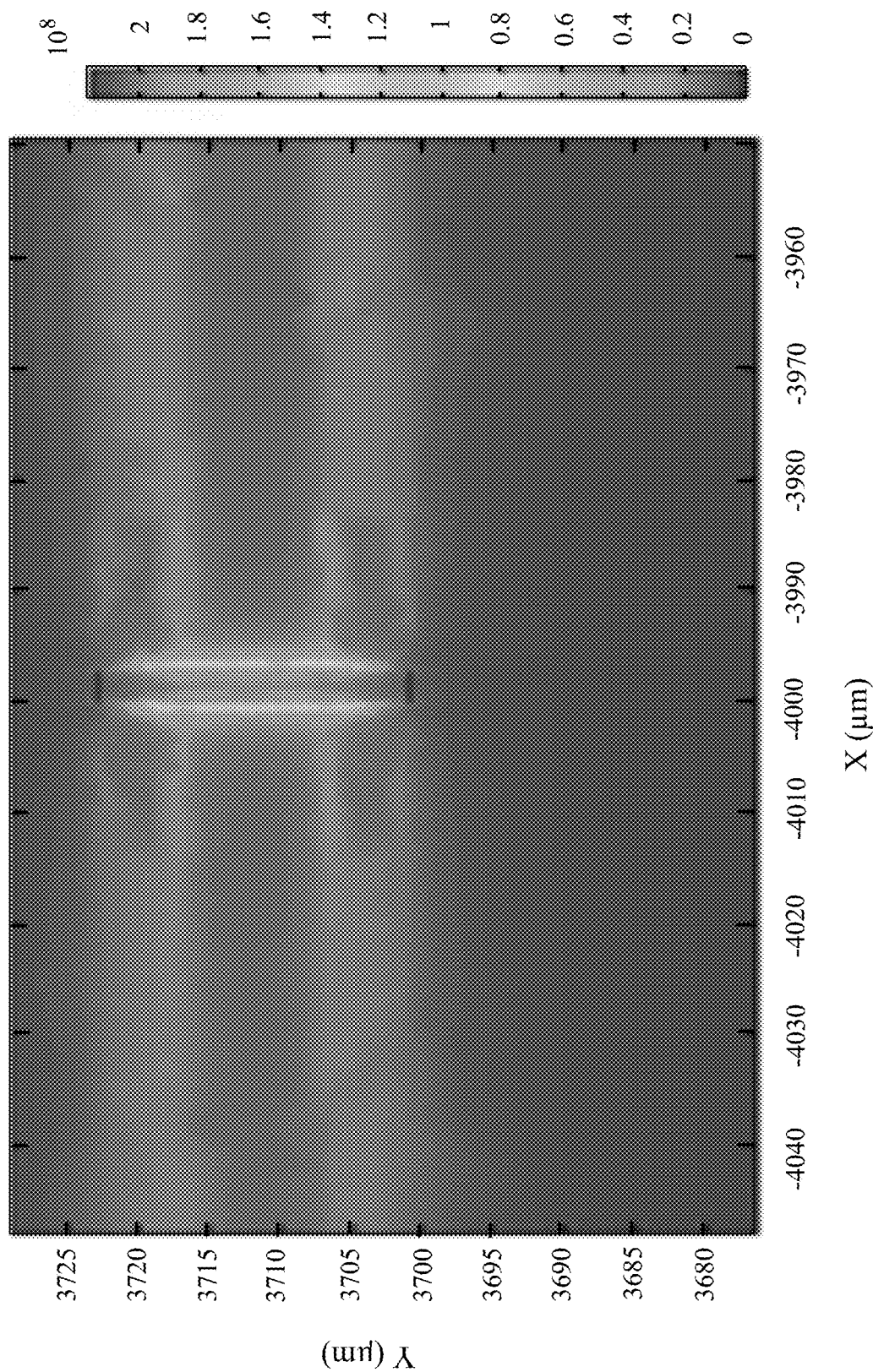
FIGS. 4F and 4G respectively illustrate schematic diagrams of simulation results of electric field intensities of example packaging structures, consistent with some embodiments of this disclosure.
Figure 4G:
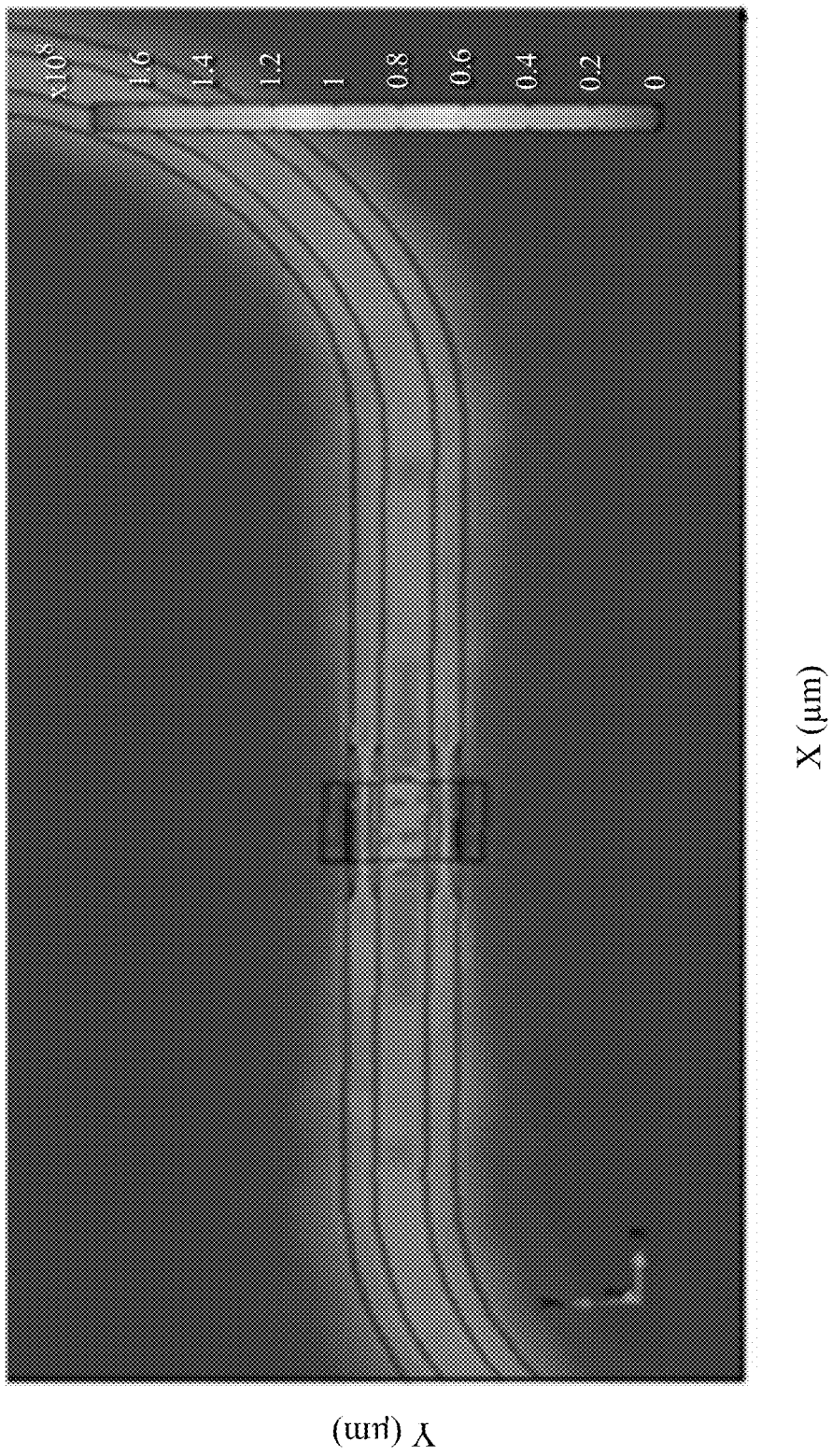
Figure 4H:
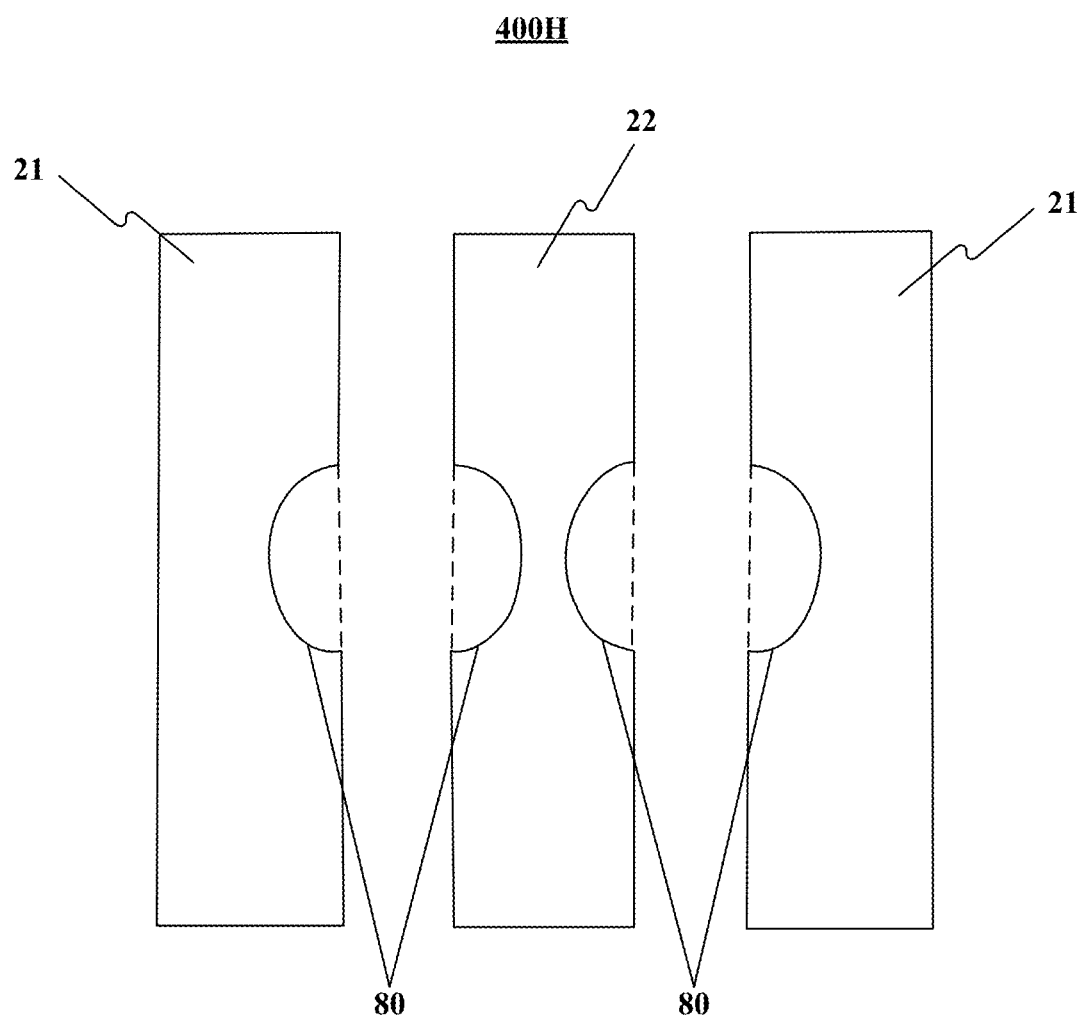
FIGS. 4H-4L respectively illustrate schematic structural diagrams of several example packaging structures, consistent with some embodiments of this disclosure.
Figure 4I:
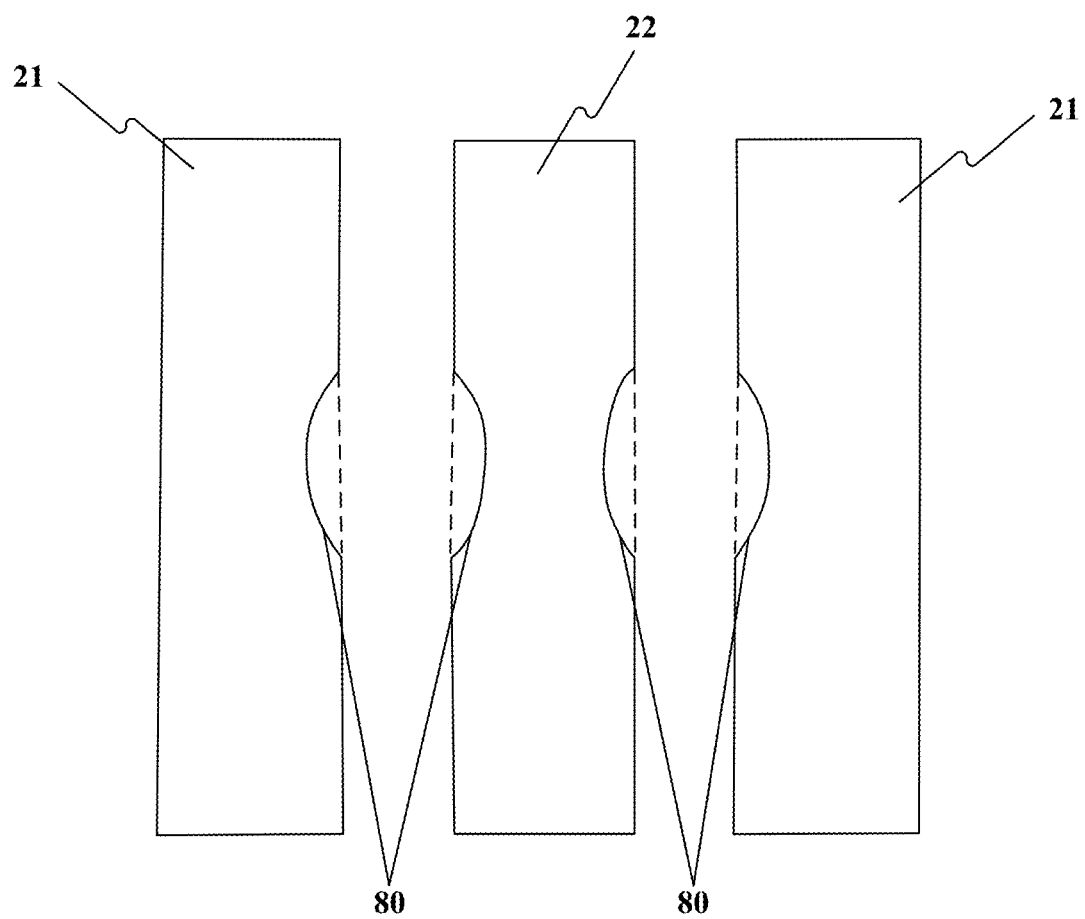
Figure 4J:
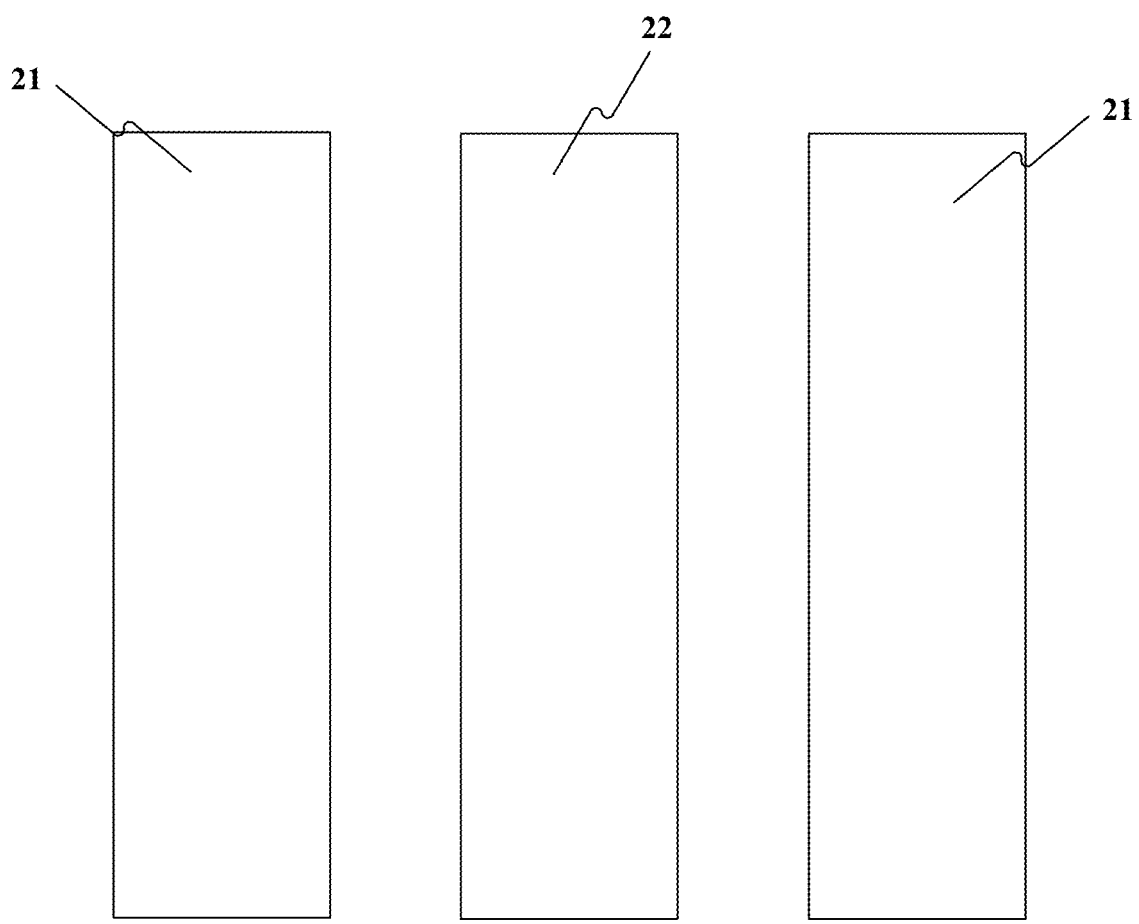
Figure 4K:
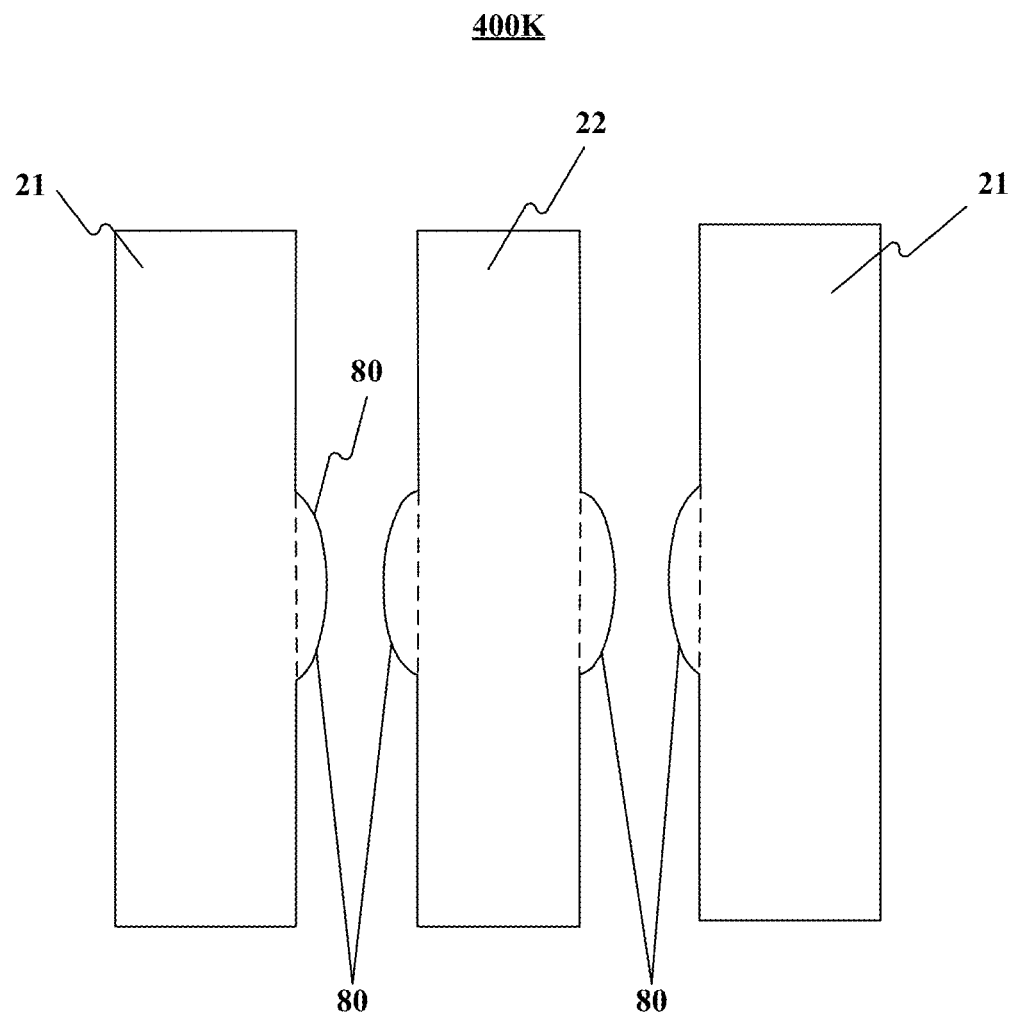
Figure 4L:
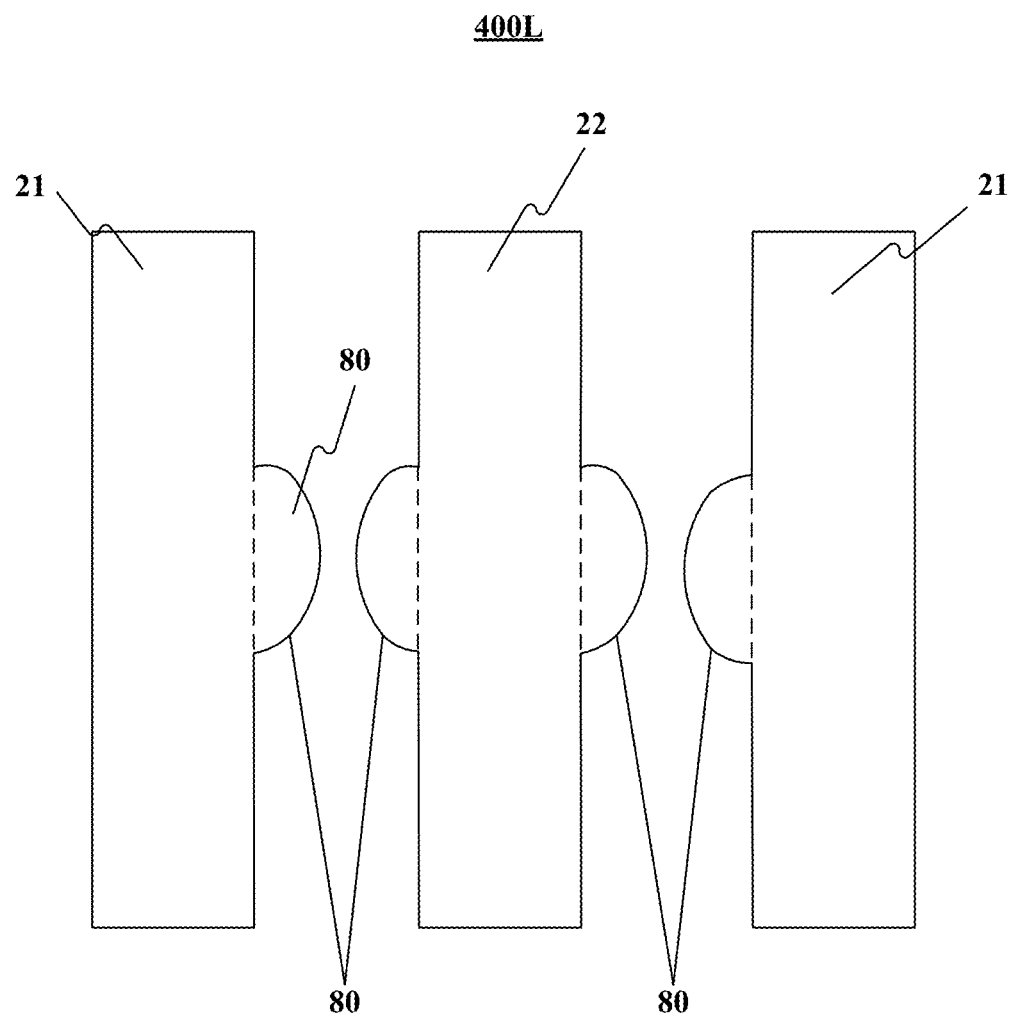

Consistent with some embodiments of this disclosure, FIGS. 4A-4C respectively illustrate diagrams of simulation results (i.e. S21 vs F GHz) obtained by simulating several example packaging structures, and FIGS. 4F and 4G respectively illustrate diagrams of simulation results of electric field intensities in the X (μm) and Y (μm) directions of example packaging structures. The simulation results illustrated in FIGS. 4A-4C, 4F and 4G can be associated with the above-described first, second, and third simulation, for example. From the analysis of the simulation results in FIGS. 4A-4C, 4F and 4G, the Qi value of the coplanar waveguide in the first simulation is significantly greater than the Qi values of the coplanar waveguides in the second and third simulations. For example, the Qi value of the coplanar waveguide in the first simulation can reach around 2,000,000, as illustrated in FIG. 4A. The Qi value of the coplanar waveguide in the second simulation drops to around 1,000,000, as illustrated in FIG. 4B. The Qi value of the coplanar waveguide in the third simulation is 1,640,000, as illustrated in FIG. 4C. FIGS. 4A-4C also show values of outcoupling coefficients Qc and values of resonance center frequencies F0 obtained by fitting for the above-described first, second, and third simulation. Specifically, FIG. 4A shows that the first simulation provides $Qi=1.98\times10^6$, $Qc=2.203\times10^4$, $F0=6.940387$ GHz; FIG. 4B shows that the second simulation provides $Qi=1.05\times10^6$, $Qc=1.124\times10^4$, $F0=6.93849$ GHz; and FIG. 4C shows that the third simulation provides $Qi=1.64\times10^6$, $Qc=1.547\times10^4$, $F0=6.93335$ GHz.

FIG. 4F shows an electric field distribution on a surface of an air bridge (e.g., air bridge 70 in FIGS. 1 and 2A). FIG. 4G shows the electric field distribution in the coplanar waveguide. FIG. 4F shows that adding the air bridge to a packaging structure (e.g., packaging structure 100 in FIG. 1 or packaging structure 200A in FIG. 2A) can induce an electric field on the surface of the air bridge. This electric field can be directly connected to ground wires (e.g., ground wires 21 in FIGS. 1 and 2A-2D) and dissipated from the ground wires to become a dissipation channel (e.g., a dissipation channel for microwave energy). FIG. 4G shows that after adding a compensation structure (e.g., compensation structure 80 in FIGS. 1 and 2A-2D), the energy of the electric field can be more localized on a signal wire (e.g., signal wire 22 in FIGS. 1 and 2A-2D). The localized energy can exist in the signal wire and not constitute a microwave dissipation channel. In such a case, the energy induced on the air bridge can be greatly reduced. As illustrated in FIGS. 4F and 4G, the electric field induced on the air bridge can be seen in the electromagnetic simulation. When the compensation structure is added under the air bridge, most of the induced electric field can be distributed on a signal transmission line (e.g., the signal wire) to avoid energy loss caused by the induction of the ground wires.

Consistent with some embodiments of this disclosure, FIG. 4D illustrates a 3D (i.e. X-Y-Z directions) sketch drawing of an example packaging structure 400 in a finite-element analysis (FEA) software. For example, packaging structure 400 can be a partial structure of a chip with a compensation structure added. The FEA software can include a COMSOL® model. Due to the viewing angle, the compensation structure added to packaging structure 400 cannot be seen in FIG. 4D. In some embodiments, one or both of ground wires 21 in packaging structure 400 can include the added compensation structure. Consistent with some embodiments of this disclosure, FIG. 4E illustrates a 3D (i.e. X-Y-Z directions) drawing of packaging structure 400 in the FEA software. In FIG. 4E, the added compensation structure 80 can be shown.

As illustrated and described in association with FIGS. 4A-4G, when the air bridge is added, an effective capacitor can be introduced to the original coplanar waveguide. The effective capacitor can compensate for some capacitive or inductive structures in the coplanar waveguide to offset the effective capacitor's interference with an existing resonance frequency. Also, the capacitive structure can introduce an induced electric field and a loss factor in a high-frequency signal transmission process. To reduce the loss factor of a single air bridge, the intensity of the induced electric field can be reduced as much as possible.

It should be noted that the substrate (e.g., substrate 10 in FIG. 1) described in this disclosure can be any feasible substrate. Generally, a material with low dielectric loss can be selected as the substrate. For example, the substrate can be a silicon substrate, a germanium substrate, a silicon germanium substrate, a sapphire substrate, or any of their combinations. The substrate formed of a suitable material can be selected based on application situations and is not limited to the examples described herein.

Figure 2B:
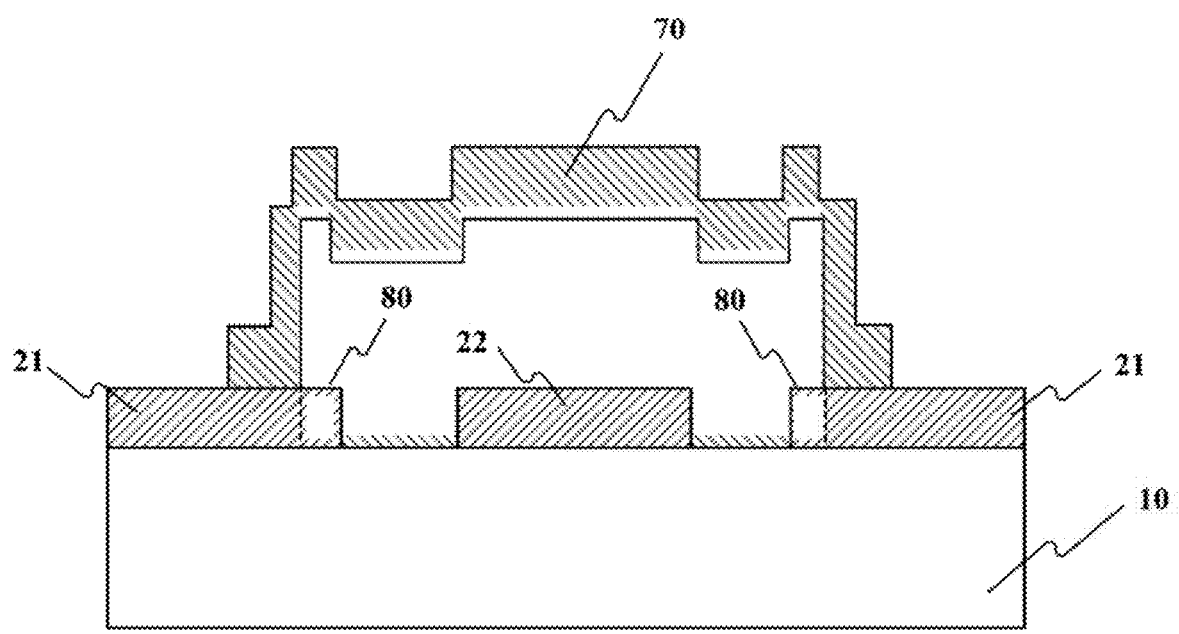
Figure 2C:
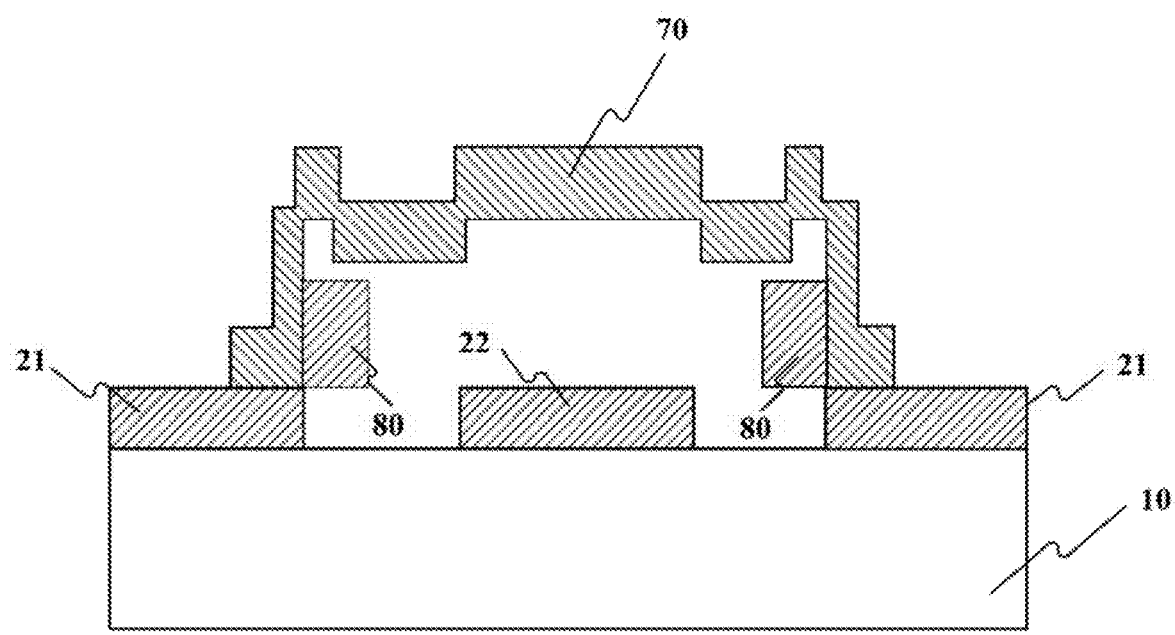

Consistent with some embodiments of this disclosure, the compensation structure (e.g., compensation structure 80 in FIG. 1) can be located on at least one of the surface of the substrate (e.g., substrate 10 in FIG. 1), the surface of the coplanar waveguide (e.g., the coplanar waveguide that includes ground wires 21 and signal wire 22 as illustrated in FIG. 1), or the surface of the air bridge (e.g., air bridge 70 in FIG. 2C).

In a first example, in some embodiments, the compensation structure can be located only on the surface of the substrate (e.g., substrate 10 in FIG. 1) in a contact mode. When the exposed part of the substrate is located between the ground wires and the signal wire, the compensation structure can be located on the surface of the substrate between the ground wires and the signal wire, and is not in contact with the ground wires or the signal wire.

In a second example, in some embodiments, at least one compensation structure can be located only on the surface of the coplanar waveguide in a contact mode. For example, the at least one compensation structure can be located on surfaces of the ground wires (e.g., ground wires 21 in FIG. 3A), on a surface of the signal wire (e.g., signal wire 22 in FIG. 3B), or on the surfaces of both the ground wires 22 and the signal wire 22, as shown in FIG. 3B.

In a third example, in some embodiments, the compensation structure can be located only on the surface of the air bridge (e.g., air bridge 70 in FIG. 2C) in a contact mode and is not in contact with the coplanar waveguide or the substrate. For example, compensation structure 80 in the packaging structure 200C as shown in FIG. 2C is located only on the surface of air bridge 70.

In a fourth example, in some embodiments, the compensation structure can be located on the surface of the substrate in a contact mode and also located on the surface of the coplanar waveguide in a contact mode. For example, a first surface of the compensation structure can be in contact with the surface of the substrate, and a second surface of the compensation structure can be in contact with the coplanar waveguide. As another example, the compensation structure can be in contact with the ground wires of the coplanar waveguide, the signal wire of the coplanar waveguide, or both the ground wires and the signal wire.

In a fifth example, in some embodiments, the compensation structure can be located on the surface of the coplanar waveguide in a contact mode and also located on the surface of the air bridge in a contact mode. For example, the compensation structure can be in contact with only the ground wires of the coplanar waveguide, only the signal wire of the coplanar waveguide, or both the ground wires and the signal wire.

In a sixth example, in some embodiments, the compensation structure can be located on the surface of the substrate in a contact mode and also located on the surface of the air bridge in a contact mode. For example, a first surface of the compensation structure can be in contact with the surface of the substrate between the ground wires and the signal wire, and a second surface of the compensation structure can be in contact with the air bridge.

In a seventh example, in some embodiments, the compensation structure can be located on the surface of the coplanar waveguide in a contact mode and also located on the surface of the air bridge in a contact mode. For example, the compensation structure can be in contact with only the ground wires of the coplanar waveguide, only the signal wire of the coplanar waveguide, or both the ground wires and the signal wire.

In an eighth example, in some embodiments, the compensation structure can be located simultaneously on the surface of the substrate in a contact mode, the surface of the coplanar waveguide in a contact mode, and the surface of the air bridge in a contact mode.

It should be noted that the position of the compensation structure can be determined based on application conditions (e.g., difficulty level of fabricating the compensation structure) in this disclosure. It should also be noted that there can be one or more compensation structures in the packaging structure. One or more compensation structures can be disposed in different application situations. The compensation structures can be disposed at the same or different positions and are not limited to the example positions (e.g., surfaces) described herein.

Because the compensation structures can be disposed at different positions, manufacturing processes of corresponding chips including the compensation structures can be different in terms of difficulty. To reduce the difficulty of manufacturing the packaging structure, to increase the manufacturing efficiency, and to achieve convenient mass production, in some embodiments, a compensation structure can be located on at least one of the surface of the substrate or the surface of the coplanar waveguide. Such a compensation structure can be relatively easy to manufacture. In the packaging structure, the compensation structure being located on the surface of the substrate and the surface of the coplanar waveguide can be the same or different compensation structures with the compensation structure being located only on the surface of the substrate.

Consistent with some embodiments of this disclosure, a compensation structure can be located on at least one of the surface of the substrate, the surface of the coplanar waveguide, or the surface of the air bridge. For example, the compensation structure can be located on the surface of the substrate, the surface of the coplanar waveguide, and the surface of the air bridge. In some embodiments, a first compensation structure can be simultaneously disposed on one or more surfaces of the packaging structure in a contact mode. The first compensation structure and the compensation structure being located on the surface of the substrate can be the same or different compensation structures. In a case where the first compensation structure and the compensation structure being located on the surface of the substrate are different compensation structures, the packaging structure can include at least two compensation structures. As another example, a second compensation structure can be located on the surface of the coplanar waveguide and the surface of the air bridge. The second compensation structure and the compensation structure being located on the surface of the waveguide can be the same or different compensation structures. In a case where the second compensation structure and the compensation structure being located on the surface of the waveguide are different compensation structures, the packaging structure can include at least two compensation structures.

In some embodiments, a packaging structure can include a plurality of compensation structures, in which at least one of the compensation structures can be located on the surface of the coplanar waveguide and not on the surface of the substrate. In such cases, the compensation structure can also be located on the surface of the coplanar waveguide in a contact mode. For example, the at least one of the compensation structures can be located only on the surfaces of the ground wires, only on the surface of the signal wire, or both on the surfaces of the ground wires and the surface of the signal wire. In another example, at least one compensation structure in the packaging structure can be located on the surface of the substrate.

In some embodiments, a packaging structure can include a plurality of compensation structures, in which at least one of the compensation structures can be located on both the surface of the coplanar waveguide and the surface of the air bridge, and not on the surface of the substrate. For example, the at least one of the compensation structures can be in contact with only the ground wires of the coplanar waveguide, only the signal wire, or both the ground wires and the signal wire. In another example, the packaging structure can also include a compensation structure on the surface of the substrate.

In some embodiments, a packaging structure can include a plurality of compensation structures, in which at least one of the compensation structures can be located only on the surface of the air bridge, and not on the surface of the coplanar waveguide or not on the surface of the substrate. In some embodiments, the packaging structure can also include a compensation structure located on the surface of the substrate.

It should also be noted that the description of being "located on a surface" of an object (e.g., a substrate, a coplanar waveguide, or an air bridge) in this disclosure refers to being disposed on the surface in a contact mode (e.g., being in contact with the surface).

Consistent with some embodiments of this disclosure, the shape of the compensation structure can be determined through software simulation. Typically, coplanar waveguide simulation design can be performed first. For example, the compensation structure can be defined first, then electromagnetic field simulation and design module optimization can be performed, after which simulation experiment calibration can be carried out. After being determined through software simulation, property measurement can be performed for the compensation structure.

By way of example, an elliptical compensation structure can be determined through software simulation that includes electromagnetic simulation and design optimization processes. FIGS. 4H-4L respectively illustrate schematic structural diagrams of example packaging structures 400H, 400I, 400J, 400K and 400L, consistent with some embodiments of this disclosure. Each of packaging structures 400H, 400I, 400K and 400L includes one or more elliptical compensation structures 80. In the design process, compensation values for elliptical compensation structure(s) 80 of packaging structures 400H, 400I, 400K and 400L are calculated to be −100%, −50%, 50%, and 100%, respectively. In FIGS. 4H-4L, a negative compensation value corresponds to a concave compensation structure, a positive compensation value corresponds to a convex compensation structure, and a zero compensation value corresponds to a flat compensation structure. The absolute values of the compensation values have a positive correlation with the magnitudes of the concaveness or the convexness.

Figure 4M:
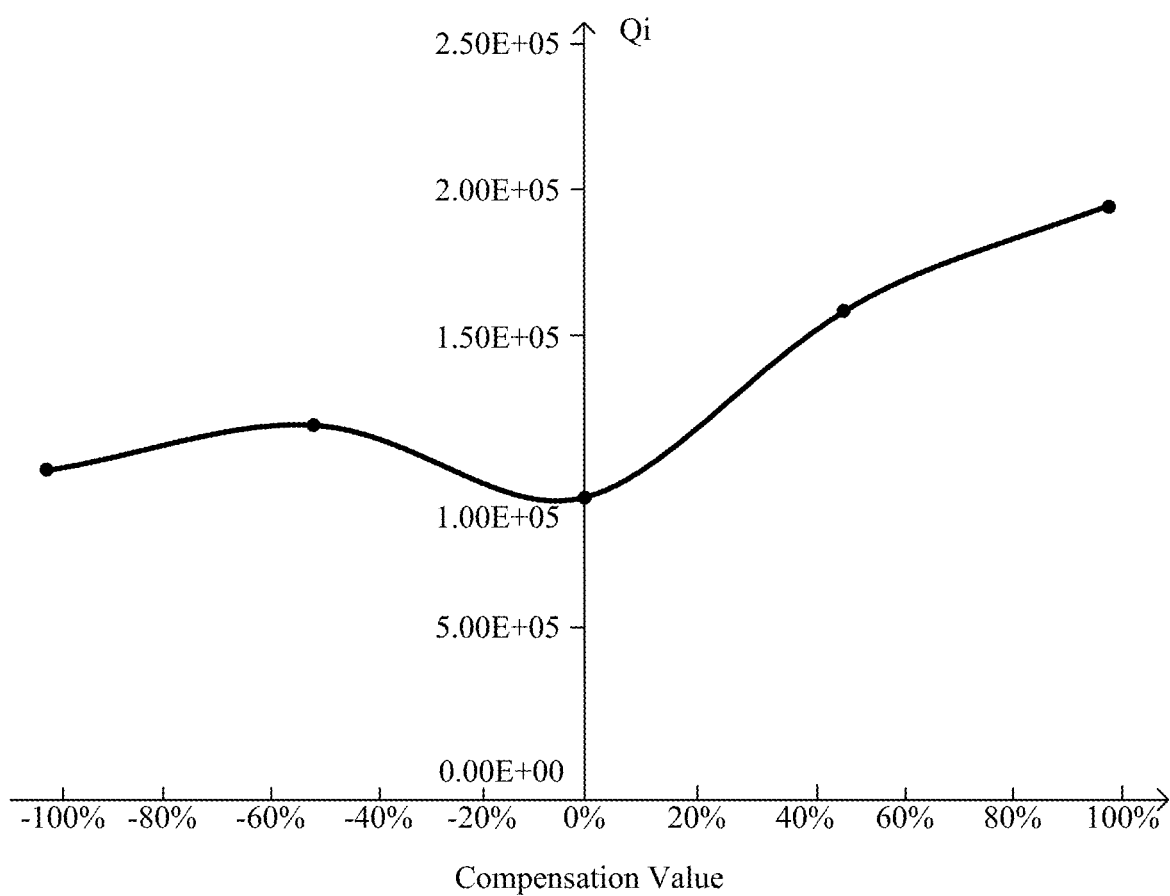
FIG. 4M illustrates an internal quality factor (Qi) variation diagram associated with packaging structures of FIGS. 4H-4L, consistent with some embodiments of this disclosure.

With reference to FIGS. 4H-4L, coplanar waveguide structures respectively corresponding to packaging structures 400H to 400L are comparatively analyzed to obtain a quality factor variation diagram. FIG. 4M illustrates an internal quality factor (Qi) variation diagram 400M associated with the example packaging structures of FIGS. 4H-4L, consistent with some embodiments of this disclosure. Based on the compensation values and their corresponding changes in quality factors illustrated in the Qi variation diagram 400M, different compensation structures 80 can be optimized.

In some embodiments, to suppress excessive localization of an electric field and to ensure that the compensation structure can further reduce dielectric loss, the exposed surface of the compensation structure (e.g., compensation structure 80 in FIG. 1) can have a curved surface. For example, the surface of the compensation structure that does not contact with other structures (e.g., at least one of the coplanar waveguide, substrate 10, or air bridge 70 in FIG. 1) can be a curved surface (e.g., a parabolic surface).

In some embodiments, a cross-sectional shape of the exposed surface of the compensation structure in a predetermined direction can be semi-elliptical or semi-circular. For example, the predetermined direction can be a thickness direction of the packaging structure. By way of example, with reference to FIGS. 1, 3A and 3B, the cross-sectional shape of the exposed surface of compensation structure 80 in the predetermined direction (e.g., the horizontal direction in FIGS. 1, 3A and 3B) is a semi-ellipse.

Consistent with some embodiments of this disclosure, the material of the compensation structure can include a superconducting material. For example, the material of the compensation structure can include aluminum (Al), niobium (Nb), tantalum (Ta), aluminum nitride (AlN), or titanium nitride (TiN). It is noted that the material of the compensation structure is not limited to the example superconducting materials described herein and can include any other suitable superconducting materials.

Figure 2D:
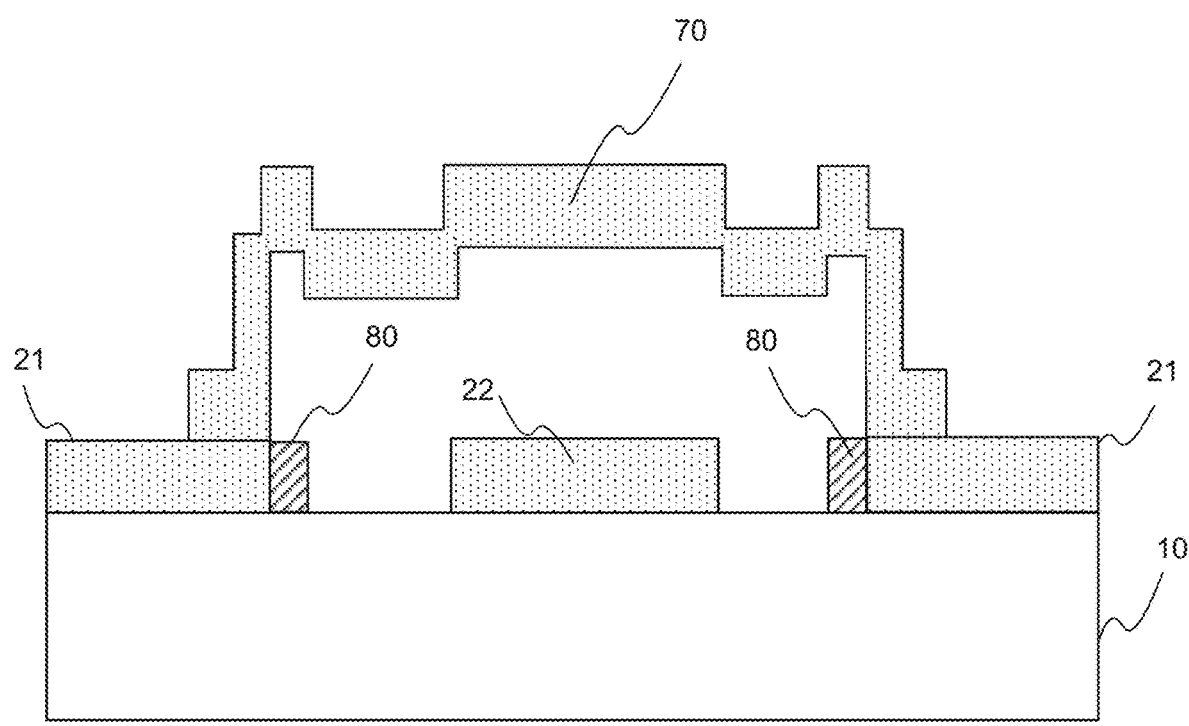

In some embodiments, the coplanar waveguide material and the air bridge material in this disclosure can be superconducting materials that can be the same as or different from the material of the compensation structure. For example, as shown in FIG. 2A, the coplanar waveguide (ground wires 21 and signal wire 22) and air bridge 70 in the packaging structure 200A are made of the same superconducting material used for the compensation structure 80; whereas, as shown in FIG. 2D, the coplanar waveguide (ground wires 21 and signal wire 22) and air bridge 70 in the packaging structure 200D are made of a superconducting material that is different from the superconducting material used for the compensation structure 80. The thickness of a coplanar waveguide material layer in this disclosure can be determined based on application conditions as long as the coplanar waveguide can achieve superconductivity. For example, when the coplanar waveguide material is Al, the thickness of the coplanar waveguide material layer can be greater than 50 nanometers (nm).

Consistent with some embodiments of this disclosure, the compensation structure can be of a dense physical structure or a hollow structure. For example, compensation structure 80 in the packaging structure 200B as shown in FIG. 2B has a hollow structure. It should be noted that a dense physical structure or a hollow structure can be selected based on application conditions.

Figure 5:
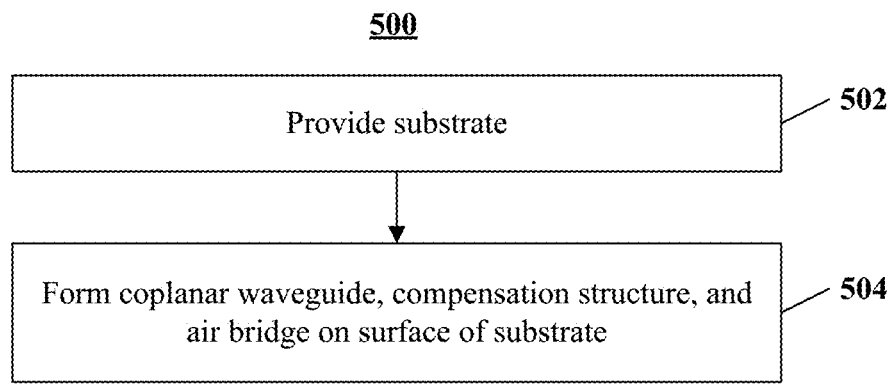
FIG. 5 is a flowchart of an example method of manufacturing a packaging structure, consistent with some embodiments of this disclosure.

Consistent with some embodiments of this disclosure, a manufacturing method for a packaging structure is provided. By way of example, FIG. 5 is a flowchart of an example method 500 of manufacturing a packaging structure (e.g., packaging structure 100 as illustrated and described in association with FIG. 1). As illustrated in FIG. 5, method 500 includes steps 502 and steps 504

Figure 6:
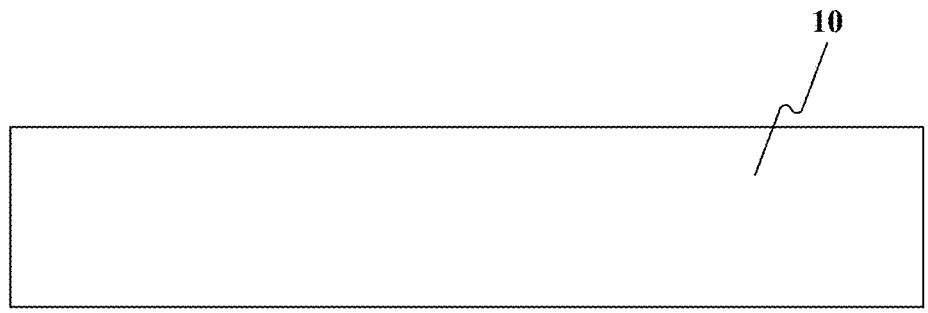
FIGS. 6-19 illustrates schematic structural diagrams of an example packaging structure during a manufacturing process, consistent with some embodiments of this disclosure.

At step 502, a substrate is provided. By way of example, the substrate can be a substrate 10 as illustrated in FIG. 6.

At step 504, a coplanar waveguide, a compensation structure, and an air bridge are formed on a surface of the substrate (e.g., substrate 10 in FIG. 6) to form a packaging structure. For example, the packaging structure can be packaging structure 100 illustrated and described in association with FIG. 1, packaging structure 200A illustrated and described in association with FIG. 2A, packaging structures 300A to 300C illustrated and described in association with FIGS. 3A-3C respectively, packaging structure 400 illustrated and described in association with FIGS. 4D and 4E, or packaging structures 400H to 400L illustrated and described in association with FIGS. 4H-4L.

In some embodiments, the compensation structure can be formed on at least one of the surface of the substrate, the surface of the coplanar waveguide, or the surface of the air bridge. By way of example, with reference to FIG. 1, the coplanar waveguide can include two ground wires (e.g., ground wires 21) and a signal wire (e.g., signal wire 22) disposed on the surface of the substrate (e.g., substrate 10) at intervals. The signal wire can be located between the two ground wires. The compensation structure (e.g., compensation structure 80) can be located on at least one of the surface of the substrate, a surface of the coplanar waveguide, or a surface of the air bridge (e.g., air bridge 70). One end of the air bridge can be connected with one of the ground wires, and the other end of the air bridge can be connected with the other one of the ground wires. A gap can exist between the air bridge and a surface of the signal wire away from the substrate.

In some embodiments, to reduce the difficulty of implementing method 500, step 504 can include forming the coplanar waveguide and compensation structure on the substrate, then forming the air bridge on the surface of the coplanar waveguide. For example, after step 504, packaging structure 200A as illustrated in FIG. 2A can be formed. By doing so, the coplanar waveguide and the compensation structure can be formed synchronously, thus making method 500 simpler and more efficient.

Figure 7:
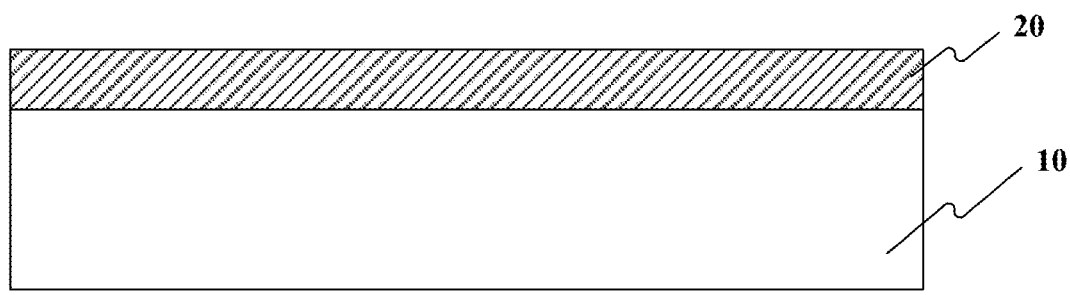
Figure 8:
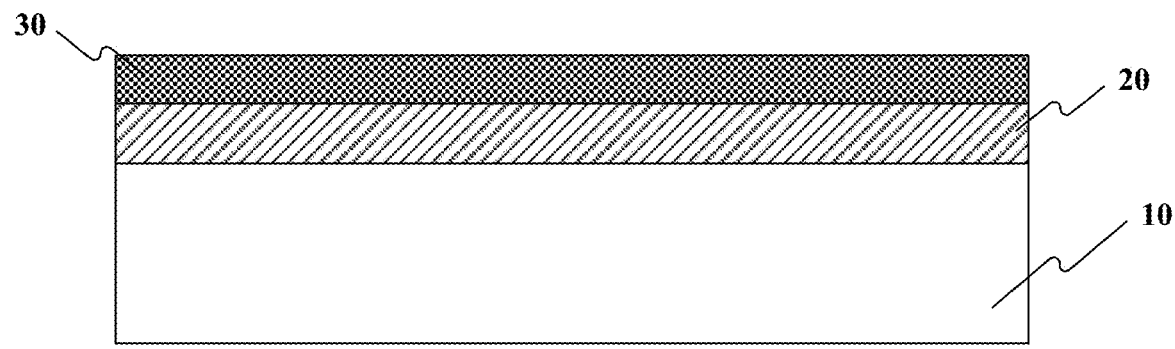

In some embodiments, to form the coplanar waveguide and the compensation structure on the substrate, step 504 can include disposing a coplanar waveguide material layer on the surface of the substrate, disposing a first photoresist layer on a surface of the coplanar waveguide material layer, and etching the first photoresist layer and the coplanar waveguide material layer at least once to form the coplanar waveguide and the compensation structure on the surface of the substrate. By way of example, the coplanar waveguide material layer can be a waveguide material layer 20 as illustrated in FIGS. 7 and 8. The first photoresist layer can be a first photoresist layer 30 as illustrated in FIG. 8.

In some embodiments, to etch the first photoresist layer and the coplanar waveguide material layer at least once to form the coplanar waveguide and the compensation structure on the surface of the coplanar waveguide, step 504 can include etching the first photoresist layer (e.g., first photoresist layer 30 in FIG. 8) and the coplanar waveguide material layer (e.g., waveguide material layer 20 in FIG. 8) once to form two ground wires, a signal wire, and the compensation structure. For example, the first photoresist layer can be exposed and developed in the etching process, after which the coplanar waveguide material can be etched. In some embodiments, to etch the coplanar waveguide material, a dry etching technique or a wet etching technique can be adopted. For example, the dry etching can include reactive ion etching (RIE) or inductively coupled plasma (ICP) etching.

Figure 9:
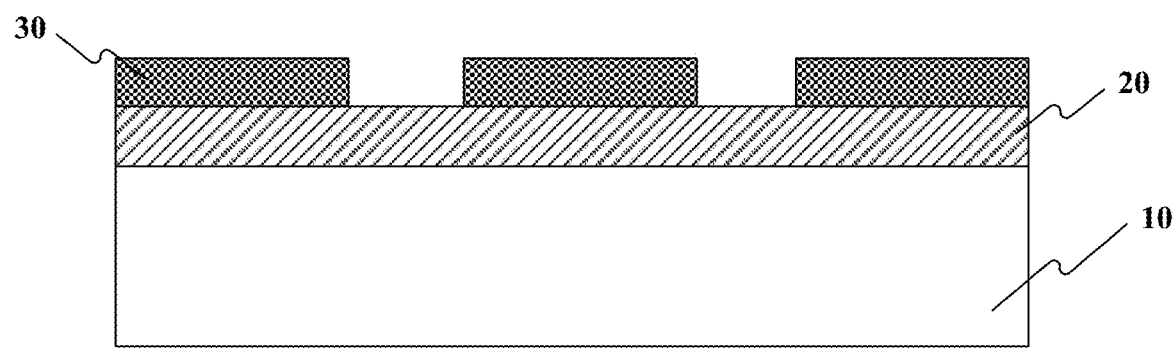
Figure 10:
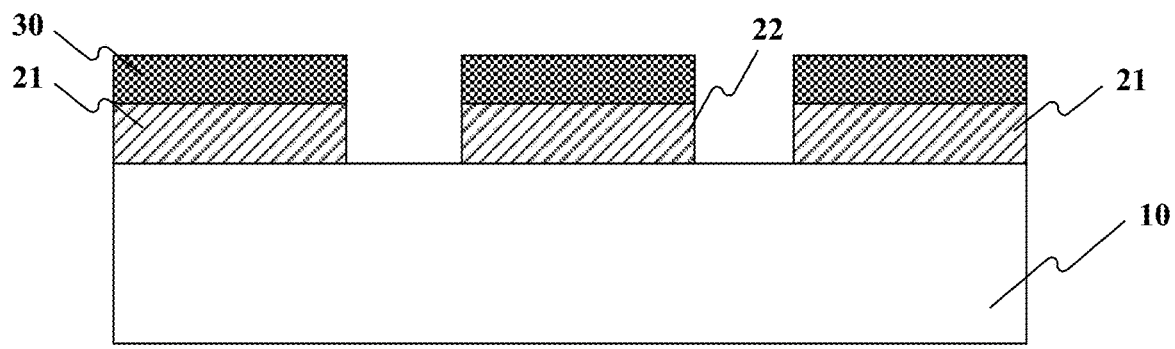
Figure 11:
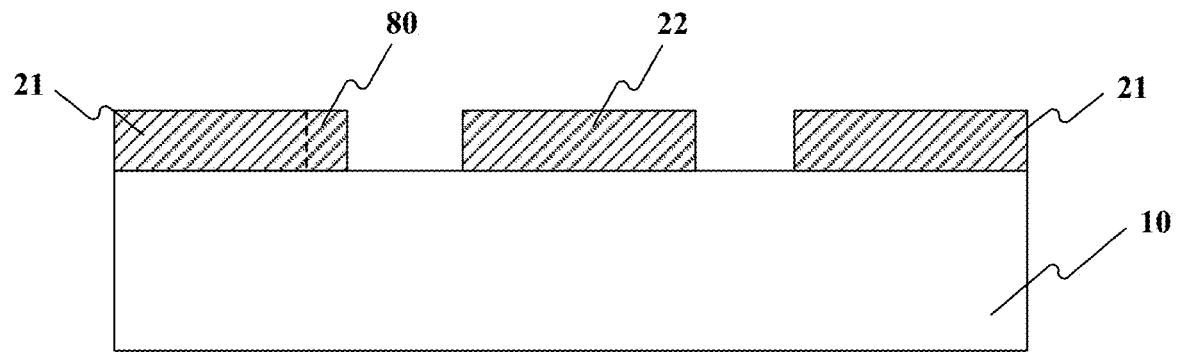

By way of example, FIG. 9 illustrates a structure formed after etching and removing part of first photoresist layer 30. FIG. 10 illustrates a structure formed after etching part of waveguide material layer 20. As illustrated in FIG. 10, the coplanar waveguide includes two ground wires 21 and a signal wire 22. The compensation structure can be located in a gap between signal wire 22 and at least one of ground wires 21. FIG. 11 illustrates the coplanar waveguide (including ground wires 21 and signal wire 22) and a compensation structure 80 on the surface of substrate 10 after removing the rest of first photoresist layer 30 as illustrated in FIG. 10. As illustrated in FIG. 11, compensation structure 80 is located on a side wall of one of ground wires 21 and on the surface of substrate 10. It should be noted that, in some embodiments, more than one compensation structures 80 can be located on multiple side walls of ground wires 21, which are not limited to the example illustrations and descriptions provided herein. In FIG. 11, the material of compensation structure 80 is the same as the material of the coplanar waveguide. As such, a dotted line is added to distinguish ground wires 21 and compensation structure 80 in FIG. 11. In some embodiments, compensation structure 80 can be located on a side wall of signal wire 22, which is not illustrated in FIG. 11. In some embodiments, compensation structure 80 can be located on both a side wall of signal wire 22 and a side wall of one of ground wires 21, which is not illustrated in FIG. 11.

In some embodiments, to form the air bridge on the surface of the coplanar waveguide, step 504 can include forming a sacrificial structure on an exposed surface of the compensation structure (e.g., compensation structure 80 in FIG. 11), an exposed surface of the signal wire (e.g., signal wire 22 in FIG. 11), exposed surfaces of the substrate (e.g., substrate 10 in FIG. 11) on both sides of the signal wire, and part of exposed surfaces of the ground wires (e.g., ground wires 21 in FIG. 11). The lowest position of a surface of the sacrificial structure away from the substrate can be higher than a surface of the coplanar waveguide away from the substrate. After forming the sacrificial structure, the air bridge can be formed on an exposed surface of the sacrificial structure and partially-exposed surfaces of the ground wires. Then, the sacrificial structure can be removed to form the packaging structure (e.g., packaging structure 200A illustrated and described in association with FIG. 2A). It should be noted that the removing of the sacrificial structure can be different from conventional etching. In some embodiments, steam can be used to remove the sacrificial structure. For example, if the material of the sacrificial structure is silica, hydrofluoric acid vapor can be used to remove the sacrificial structure. By doing so, the air bridge can be formed without conventional etching, and thus the dielectric loss caused by remnant photoresist (e.g., remnant of first photoresist layer 30 in FIGS. 8-10) can be reduced as much as possible.

Figure 12:
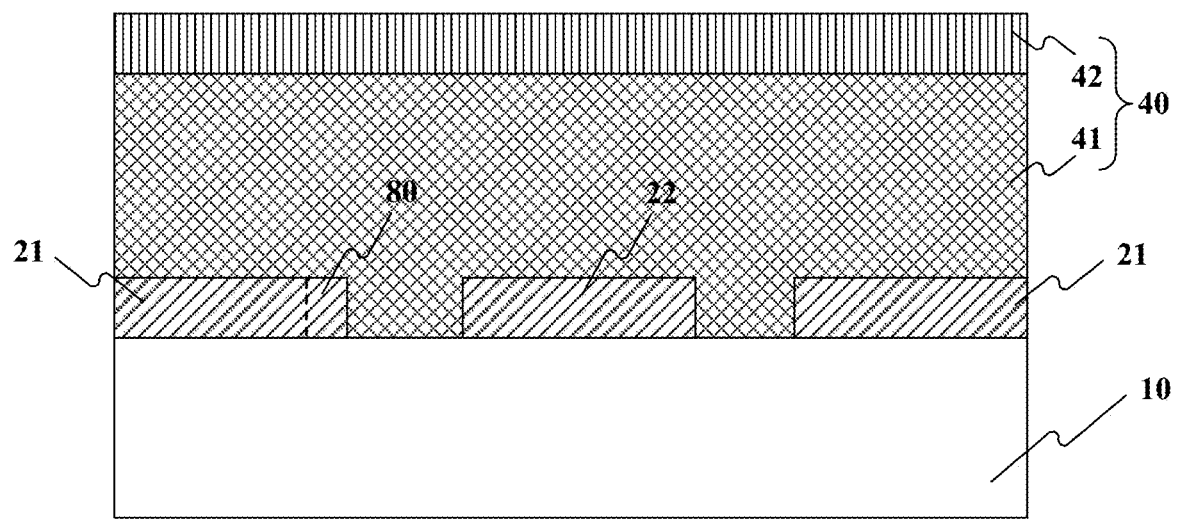

In some embodiments, to form the sacrificial structure, step 504 can include forming a predetermined structure on the exposed surface of the substrate, an exposed surface of the coplanar waveguide, and the exposed surface of the compensation structure. By way of example, FIG. 12 illustrates a predetermined structure 40 that is on the exposed surface of substrate 10, the exposed surface of the coplanar waveguide (including ground wires 21 and signal wire 22), and the exposed surface of compensation structure 80. In some embodiments, to form the predetermined structure, step 504 can include sequentially forming a first material layer and a second material layer on the exposed surface of the substrate, the exposed surface of the coplanar waveguide, and the exposed surface of the compensation structure 80. For example, the first material layer can be a polymethyl methacrylate (PMMA) layer, and the second material layer can be a PEGI layer. In some embodiments, the second material layer can be a methyl methacrylate (MMA) layer. It should be noted that materials of the first material layer and the second material layer in this disclosure can be selected from any material. By way of example, FIG. 12 illustrates predetermined structure 40 that includes a first material layer 41 and a second material layer 42.

Figure 13:
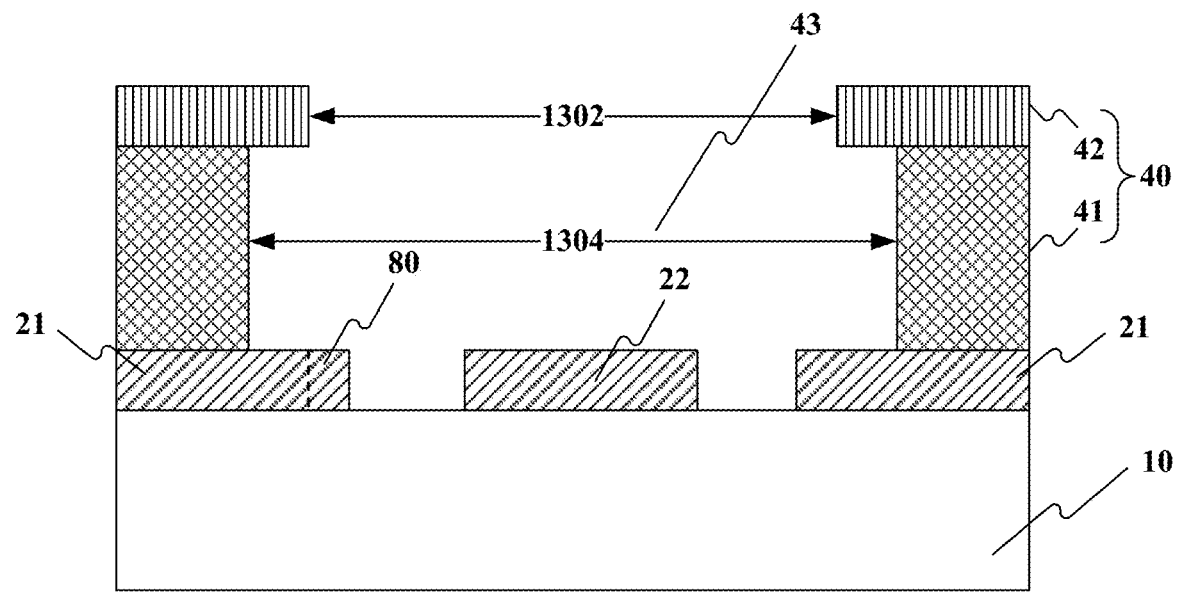

After being formed, part of the predetermined structure can be removed by etching to expose a surface of the signal wire (e.g., signal wire 22 in FIG. 12), surfaces of the substrate (e.g., substrate 10 in FIG. 12) on both sides of the signal wire, and part of surfaces of the ground wires (e.g., ground wires 21 in FIG. 12), and to form a predetermined through hole. By way of example, FIG. 13 illustrates a predetermined through hole 43 formed by removing part of predetermined structure 40. As illustrated in FIG. 13, a surface of signal wire 22, surfaces of substrate 10 on both sides of signal wire 22, and part of surfaces of ground wires 21 are exposed. Also, a first opening width 1302 of a first end of predetermined through hole 43 is smaller than a second opening width 1304 of a second end of predetermined through hole 43, in which the second end is closer to substrate 10 than the first end.

In some embodiments, with reference to FIGS. 12 and 13, to remove the part of the predetermined structure (e.g., predetermined structure 40 in FIG. 12) by etching, a predetermined etchant can be used to etch part of the first material layer and part of the second material layer. Etching rates of the predetermined etchant for the material of the substrate, the material of the coplanar waveguide, and the material of the compensation structure can be lower than etching rates of the predetermined etchant for the material of the first material layer and the material of the second material layer, such that the material of the substrate, the material of the coplanar waveguide, and the material of the compensation structure are not etched or removed while the first material layer and the second material layer are being etched by the predetermined etchant. In some embodiments, an etching rate of the predetermined etchant for the first material layer (e.g., first material layer 41 in FIG. 12) can be N, and an etching rate of the predetermined etchant for the second material layer (e.g., second material layer 42 in FIG. 12) can be M, in which N is greater than M. In some embodiments, the thickness of the first material layer and the thickness of the second material layer can be different. For example, if the predetermined etchant is a developer, the thickness of the first material layer can be between 1 micrometers (µm) and 3 µm, and the thickness of the second material layer can be between 300 nm and 800 nm. It should be noted that the thickness of the first material layer and the second material layer in this disclosure can be configured to be any thickness.

In some embodiments, with reference to FIGS. 12 and 13, to form the predetermined through hole (e.g., predetermined through hole 43 in FIG. 13), the first material layer and the second material layer can be formed by electron beam exposure, and then part of the first material layer and part of the second material layer can be removed using the predetermined etchant. Because the predetermined etchant has a higher etching rate (e.g., N) for the first material layer and a lower etching rate (e.g., M) for the second material layer, under the same etching time, more material of the first material layer can be removed by etching than the material of the second material layer, thus forming the predetermined through hole 43 as illustrated in FIG. 13 with first opening width 1302 and second opening width 1304.

As illustrated and described in association with FIGS. 12 and 13, the first material layer and the second material layer can be provided to form the predetermined structure, and the predetermined through hole can be formed by one time of electron beam exposure and one time of development subsequently. By doing so, only one time of electron beam exposure is needed to define patterns, and the coplanar waveguide can avoid corrosion because a developer for electron beam exposure is typically not an alkaline developer. As such, there is no need to dispose a protective layer on the surface of the coplanar waveguide as well as to remove the protective layer afterwards. Such a process for forming the predetermined through hole can improve the production yield of manufacturing the packaging structure.

Figure 14:
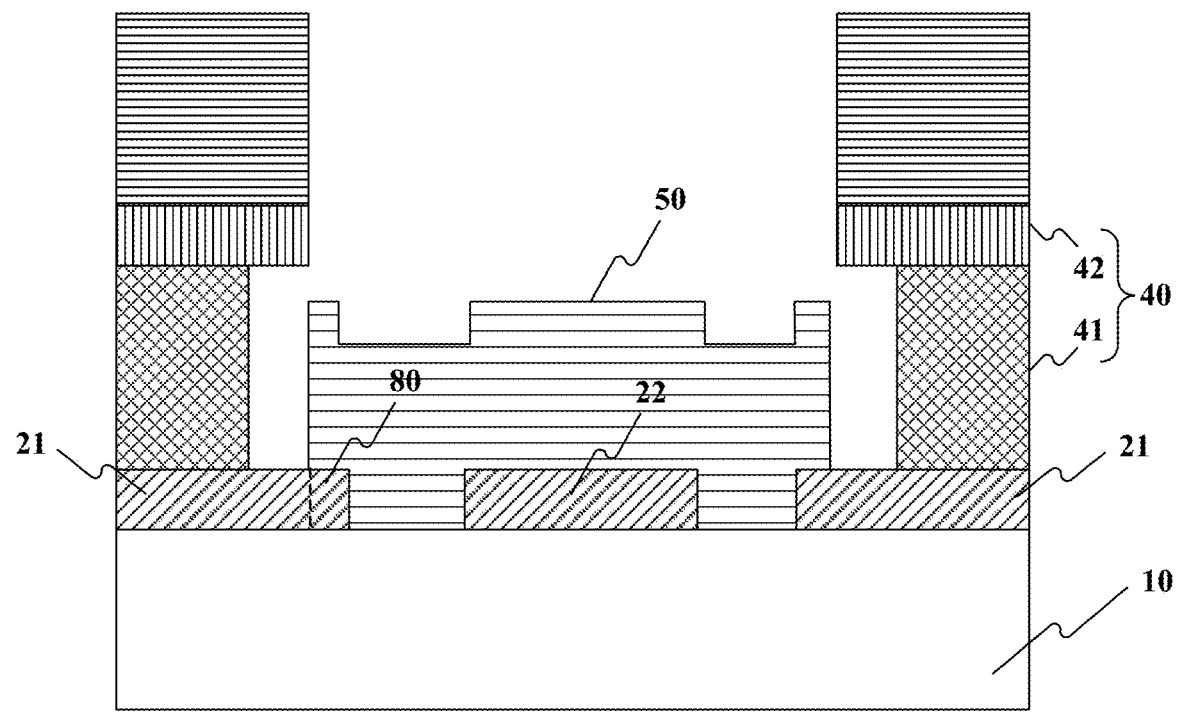

After removing the part of the predetermined structure, the sacrificial structure can be formed in the predetermined through hole. The material of the sacrificial structure can be selected based on application situations. For example, it can be silica (e.g., silicon dioxide), silicon nitride, or any combination of them. By way of example, FIG. 14 illustrates a sacrificial structure 50 formed in predetermined through hole 43 as shown in FIG. 13. As illustrated in FIG. 14, sacrificial structure 50 is on an exposed surface of compensation structure 80, an exposed surface of signal wire 22, exposed surfaces of substrate 10 on both sides of signal wire 22, and part of exposed surfaces of ground wires 21.

Figure 15:
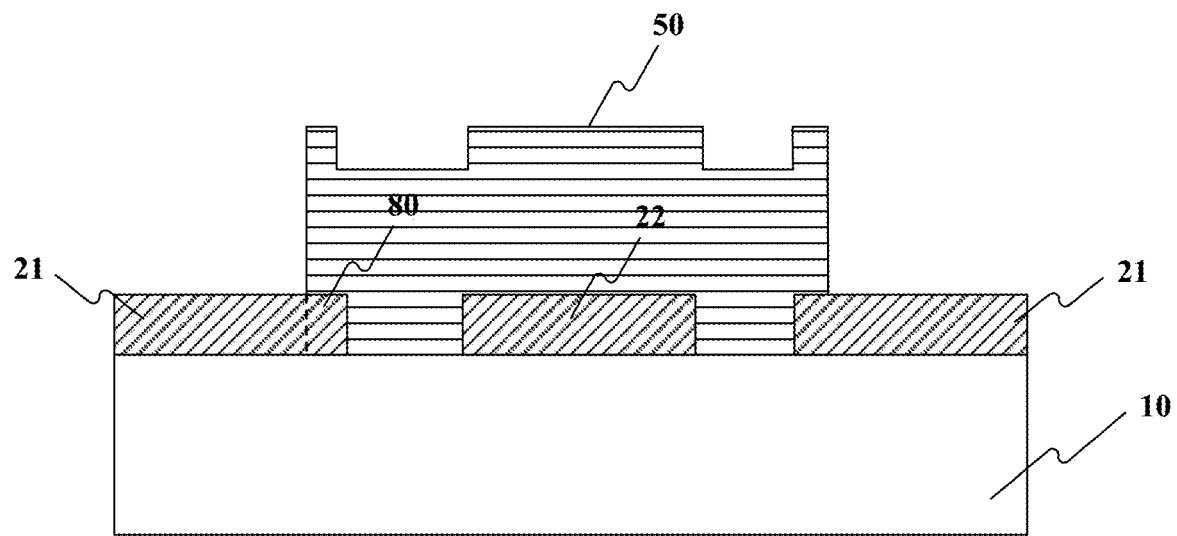

In some embodiments, referring back to FIG. 5, before forming the air bridge on the exposed surface of the sacrificial structure and the partially-exposed surfaces of the ground wires, step 504 can include removing a remaining part of the predetermined structure by etching. By way of example, FIG. 15 illustrates sacrificial structure 50 after removing a remaining part of predetermined structure 40 shown in FIG. 14.

Figure 16:
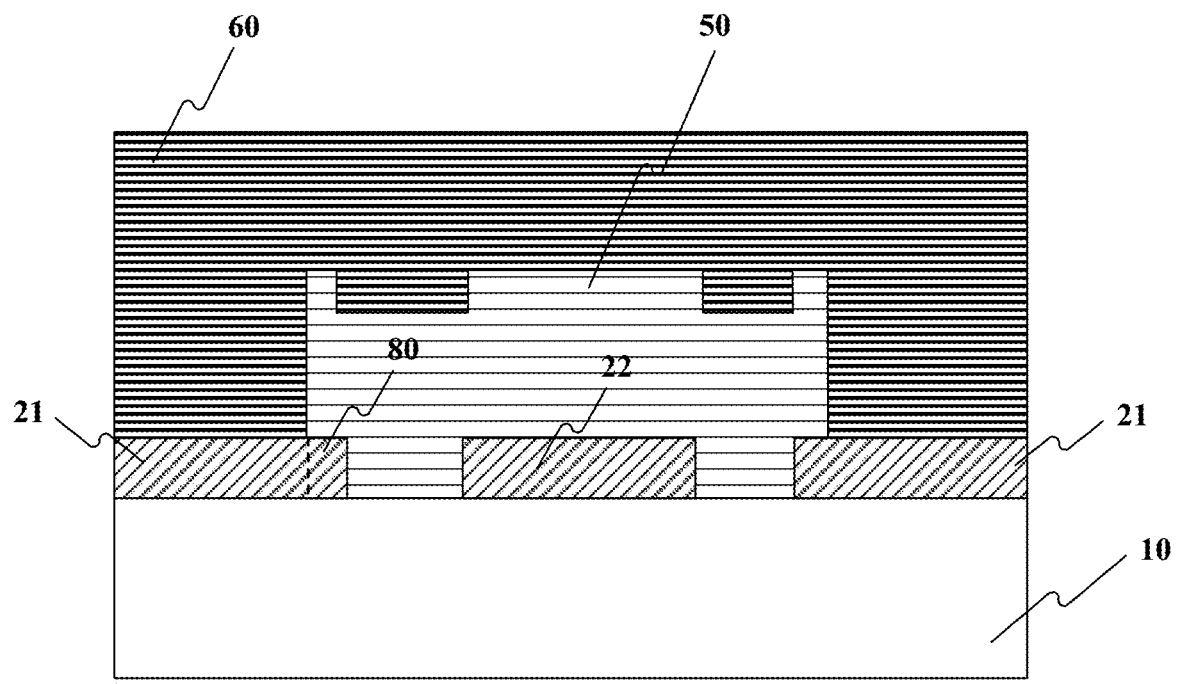
Figure 17:
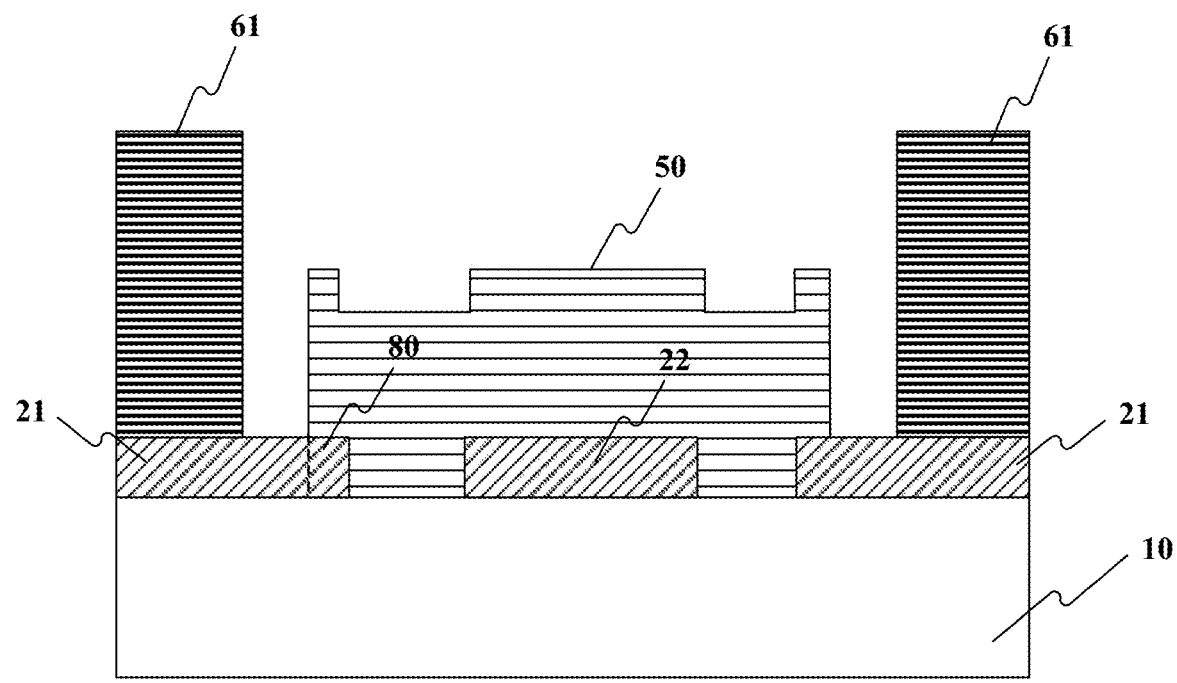

In some embodiments, to form the air bridge on the exposed surface of sacrificial structure and the partially-exposed surfaces of the ground wires, step 504 can include disposing a photoresist part on each of the ground wires on both sides of the sacrificial structure. A gap can exist between the sacrificial structure and each of the photoresist parts. For example, to dispose the photoresist parts, a second photoresist layer can be disposed on the exposed surface of the sacrificial structure, the exposed surface of the substrate, and the exposed surface of the coplanar waveguide, and then part of the second photoresist layer can be removed by performing exposure and development. By way of example, FIG. 16 illustrates a second photoresist layer 60 disposed on the exposed surface of sacrificial structure 50, the exposed surface of substrate 10, and the exposed surface of the coplanar waveguide (including ground wires 21 and signal wire 22). FIG. 17 illustrates a photoresist part 61 on each of ground wires 21 on both sides of sacrificial structure 50 after removing part of second photoresist layer 60 shown in FIG. 16 by performing exposure and development. It should be noted that the photoresist parts can be disposed by any suitable manner and are not limited to the example embodiments described herein.

After disposing the photoresist parts, an air bridge material can be disposed on exposed surfaces of the photoresist parts, the exposed surfaces of the ground wires, and the exposed surface of the sacrificial structure. Then, the photoresist parts and the air bridge material located on the exposed surfaces of the photoresist parts can be removed, in which the air bridge material located on the exposed surfaces of the ground wires and the exposed surface of the sacrificial structure are kept. The photoresist parts and the air bridge material located on the exposed surfaces of the photoresist parts can be removed by a wet corrosion technique. For example, the photoresist parts can be removed by a degumming solution, and the air bridge material located on them can be peeled off along with the photoresist parts. By doing so, the air bridge can be formed by the remaining air bridge material located on the exposed surfaces of the ground wires and the exposed surface of the sacrificial structure.

Figure 18:
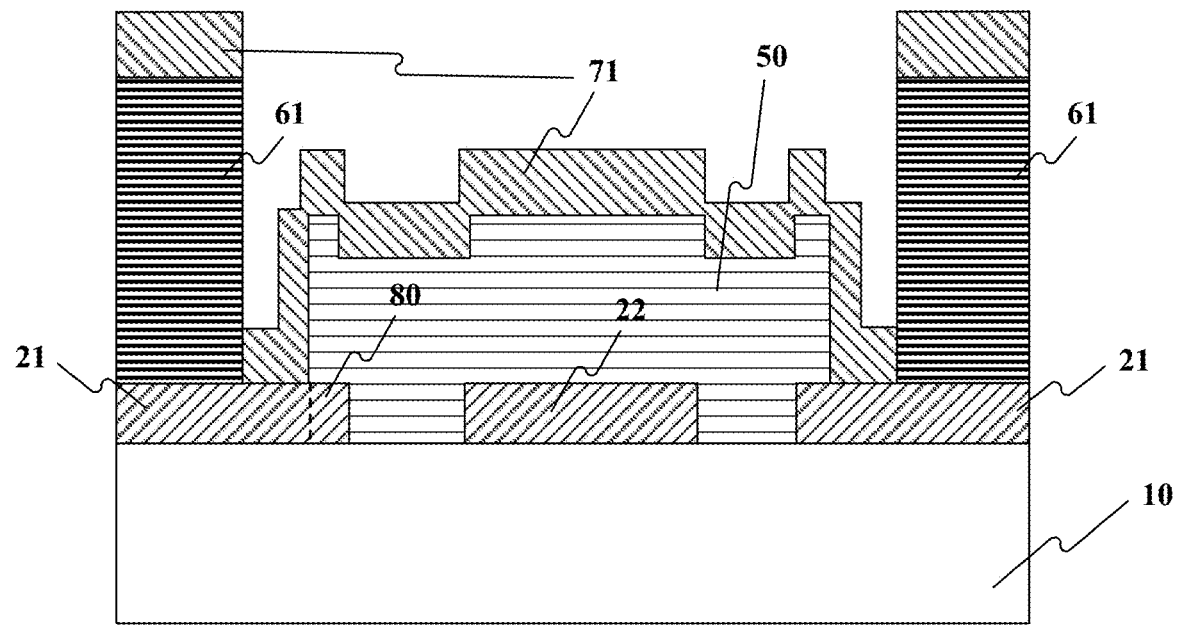
Figure 19:
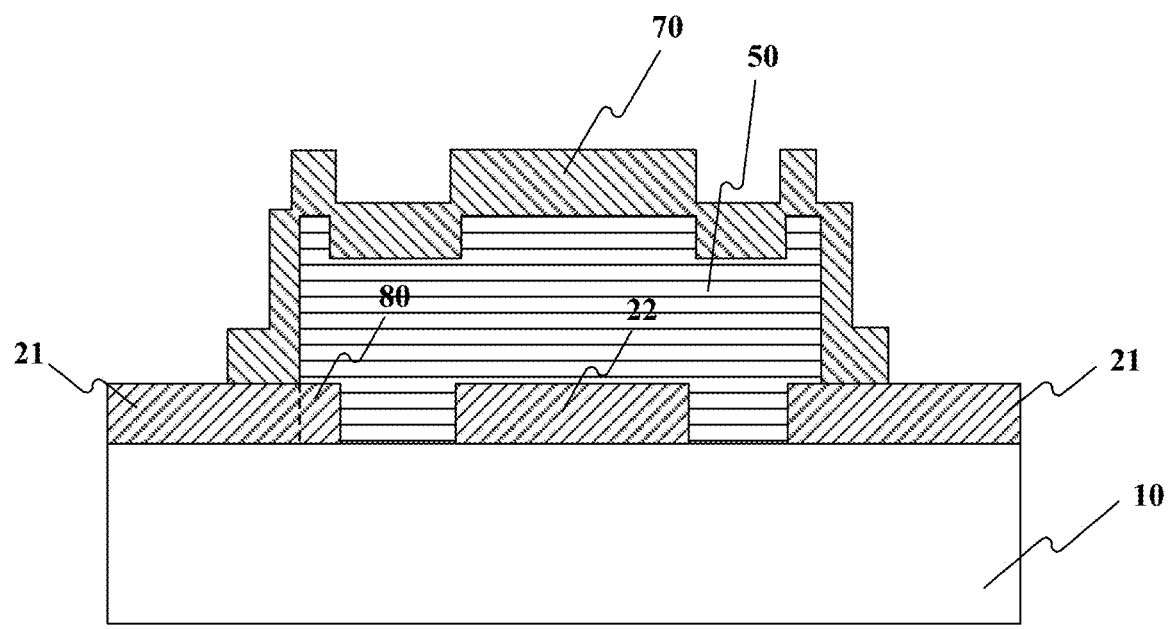

By way of example, FIG. 18 illustrates an air bridge material 71 being disposed on the exposed surfaces of photoresist parts 61, the exposed surfaces of ground wires 21, and the exposed surface of sacrificial structure 50. As illustrated in FIG. 18, an air bridge can be formed by the air bridge material 71 on the exposed surface of sacrificial structure 50 and on the partially-exposed surfaces of ground wires 21. FIG. 19 illustrates air bridge 70 formed by removing photoresist parts 61 in FIG. 18 and air bridge material 71 located on the exposed surfaces of photoresist parts 61. As illustrated in FIG. 19, air bridge 70 is formed by the remaining air bridge material 71 located on the partially-exposed surfaces of ground wires 21 and the exposed surface of sacrificial structure 50. In some embodiments, with reference to FIG. 19, after forming air bridge 70, the sacrificial structure 50 can be removed to form packaging structure 200A as illustrated in FIG. 2A.

As illustrated and described in association with FIGS. 5-19, when a signal is transmitted to the air bridge, the compensation structure can generate a local electromagnetic field between the signal wire and the ground wires, which can reduce electromagnetic loss caused from the surface of the air bridge. Compared with a packaging structure without a compensation structure, the packaging structure manufactured by method 500 can reduce energy loss, reduce decrease of an internal quality factor (Qi) of the coplanar waveguide, and thus enhance the performance of the packaging structure manufactured by method 500 as shown in FIG. 5.

It should be noted that the techniques for disposing material layers or forming material layers (except the photoresist layer) described in association with FIGS. 5-19 can include any combination of any deposition techniques for a semiconductor manufacturing process, such as, for example, atomic layer deposition (ALD), chemical vapor deposition (CVD), physical vapor deposition (PVD), plasma enhanced chemical vapor deposition (PECVD), metal organic chemical vapor deposition (MOCVD), or magnetron sputtering. In some embodiments, the first photoresist layer (e.g., first photoresist layer 30 shown in FIGS. 8-10) and the second photoresist layer (e.g., second photoresist layer 60 shown in FIG. 16) can be disposed by a spin coating technique. It should also be noted that the shape of the compensation structure (e.g., compensation structure 80 shown in FIGS. 11-19) in this disclosure can be any shape (e.g., a cube, a hemisphere, a semi-cylinder, or any other regular or irregular shape) and can be determined based on application situations.

Consistent with some embodiments of this disclosure, a first quantum processor including a packaging structure described herein is provided. Consistent with some embodiments of this disclosure, a second quantum processor including a packaging structure described herein is provided, in which the packaging structure is manufactured by a manufacturing method described herein. For example, the packaging structure can be any packaging structure illustrated and described in association with FIGS. 1, 2A-2D, 3A-3D, 4A-4L, 5-19. The manufacturing method can be method 500 illustrated and described in association with FIGS. 5-19.

The embodiments of this disclosure can further be described using the following clauses:

1. A packaging structure, comprising:
    a substrate;
    a coplanar waveguide comprising a first ground wire, a second ground wire, and a signal wire, wherein the first ground wire, the second ground wire, and the signal wire are disposed on a surface of the substrate at intervals, and the signal wire is located between the first ground wire and the second ground wire;
    an air bridge comprising a first end connected with the first ground wire and a second end connected with the second ground wire, wherein a gap exists between the air bridge and a surface of the signal wire away from the substrate; and
    a compensation structure located on the surface of the substrate.
2. The packaging structure of clause 1, wherein the compensation structure is located on the surface of the substrate and a surface of the coplanar waveguide.

3. The packaging structure of clause 1, wherein the compensation structure is located on the surface of the substrate and a surface of the air bridge.

4. The packaging structure of clause 1, wherein the compensation structure is located on the surface of the substrate, a surface of the coplanar waveguide, and a surface of the air bridge.

5. The packaging structure of clause 1, wherein the compensation structure is a first compensation structure, and the packaging structure further comprises a second compensation structure, wherein at least one of the first compensation structure or the second compensation structure is located on a surface of the coplanar waveguide and not located on the surface of the substrate.

6. The packaging structure of clause 1, wherein the compensation structure is a first compensation structure, and the packaging structure further comprises a second compensation structure, wherein at least one of the first compensation structure or the second compensation structure is located on a surface of the coplanar waveguide and a surface of the air bridge and not located on the surface of the substrate.

7. The packaging structure of clause 1, wherein the compensation structure is a first compensation structure, and the packaging structure further comprises a second compensation structure, wherein at least one of the first compensation structure or the second compensation structure is located only on a surface of the air bridge.

8. The packaging structure of clause 1, wherein the compensation structure is located on at least one of: a side wall of the signal wire, or a side wall of one of the first ground wire or the second ground wire.

9. The packaging structure of clause 8, wherein the compensation structure is located in a gap between the signal wire and one of the first ground wire or the second ground wire.

10. The packaging structure of clause 1, wherein an exposed surface of the compensation structure is a curved surface.

11. The packaging structure of clause 10, wherein a cross-sectional shape of the exposed surface of the compensation structure in a predetermined direction is semi-elliptical or semi-circular, and the predetermined direction comprises a thickness direction of the packaging structure.

12. The packaging structure of any of clauses 1-11, wherein a material of the compensation structure comprises a superconducting material.

13. The packaging structure of any of clauses 1-11, wherein the compensation structure is a hollow structure.

14. A packaging structure, comprising:
a substrate;
a coplanar waveguide comprising a first ground wire, a second ground wire, and a signal wire, wherein the first ground wire, the second ground wire, and the signal wire are disposed on a surface of the substrate at intervals, and the signal wire is located between the first ground wire and the second ground wire;
an air bridge comprising a first end connected with the first ground wire and a second end connected with the second ground wire, wherein a gap exists between the air bridge and a surface of the signal wire away from the substrate; and
a compensation structure located on a surface of the coplanar waveguide.

15. The packaging structure of clause 14, wherein the compensation structure is located on the surface of the coplanar waveguide and a surface of the air bridge.

16. A packaging structure, comprising:
a substrate;
a coplanar waveguide comprising a first ground wire, a second ground wire, and a signal wire, wherein the first ground wire, the second ground wire, and the signal wire are disposed on a surface of the substrate at intervals, and the signal wire is located between the first ground wire and the second ground wire;
an air bridge comprising a first end connected with the first ground wire and a second end connected with the second ground wire, wherein a gap exists between the air bridge and a surface of the signal wire away from the substrate; and
a compensation structure located on a surface of the air bridge.

17. A method of manufacturing a packaging structure, comprising:
providing a substrate; and
forming a coplanar waveguide, a compensation structure, and an air bridge on a surface of the substrate to form a packaging structure, wherein
the coplanar waveguide comprises a first ground wire, a second ground wire, and a signal wire, wherein the first ground wire, the second ground wire, and the signal wire are disposed on a surface of the substrate at intervals, and the signal wire is located between the first ground wire and the second ground wire;
the air bridge comprises a first end connected with the first ground wire and a second end connected with the second ground wire, wherein a gap exists between the air bridge and a surface of the signal wire away from the substrate; and
the compensation structure is located on at least one of the surface of the substrate, a surface of the coplanar waveguide, or a surface of the air bridge.

18. The method of clause 17, wherein forming the coplanar waveguide, the compensation structure, and the air bridge on the surface of the substrate comprises:
forming the coplanar waveguide and the compensation structure on the surface of the substrate; and
forming the air bridge on the surface of the coplanar waveguide.

19. The method of clause 18, wherein forming the coplanar waveguide and the compensation structure on the surface of the substrate comprises:
disposing a coplanar waveguide material layer on the surface of the substrate;
disposing a first photoresist layer on a surface of the coplanar waveguide material layer; and
etching the first photoresist layer and the coplanar waveguide material layer at least once to form the coplanar waveguide and the compensation structure located on the surface of the coplanar waveguide.

20. The method of clause 19, wherein etching the first photoresist layer and the coplanar waveguide material layer at least once to form the coplanar waveguide and the compensation structure located on the surface of the coplanar waveguide comprises:
etching the first photoresist layer and the coplanar waveguide material layer once to form the first ground wire, the second ground wire, the signal wire, and the compensation structure located in a gap between the signal wire and one of the first ground wire or the second ground wire, wherein the compensation structure is located on at least one of: a side wall of the signal wire, or a side wall of one of the first ground wire or the second ground wire; and removing a remaining part of the etched first photoresist layer.

21. The method of clause 18, wherein forming the air bridge on the surface of the coplanar waveguide comprises:

forming a sacrificial structure on an exposed surface of the compensation structure, an exposed surface of the signal wire, exposed surfaces of the substrate on both sides of the signal wire, and part of exposed surfaces of the first ground wire and the second ground wire, wherein a lowest position of a surface of the sacrificial structure away from the substrate is higher than a surface of the coplanar waveguide away from the substrate;

forming the air bridge on an exposed surface of the sacrificial structure and partially-exposed surfaces of the first ground wire and the second ground wire; and removing the sacrificial structure.

22. The method of clause 21, wherein forming the sacrificial structure on the exposed surface of the compensation structure, the exposed surface of the signal wire, the exposed surfaces of the substrate on both sides of the signal wire, and the partially-exposed surfaces of the first ground wire and the second ground wire comprises:

forming a predetermined structure on the exposed surface of the substrate, an exposed surface of the coplanar waveguide, and the exposed surface of the compensation structure;

etching to remove part of the predetermined structure to expose the surface of the signal wire, the surfaces of the substrate on both sides of the signal wire, and the part of the surfaces of the first ground wire and the second ground wire, and to form a predetermined through hole with a remaining part of the predetermined structure, wherein a first opening width of a first end of the predetermined through hole is smaller than a second opening width of a second end of the predetermined through hole, and the second end is closer to the substrate than the first end; and forming the sacrificial structure in the predetermined through hole.

23. The method of clause 22, wherein forming the air bridge on the exposed surface of the sacrificial structure and the partially-exposed surfaces of the first ground wire and the second ground wire comprises:

etching to remove the remaining part of the predetermined structure; and forming the air bridge on the exposed surface of the sacrificial structure and the partially-exposed surfaces of the first ground wire and the second ground wire.

24. The method of clause 22, wherein forming the predetermined structure on the exposed surface of the substrate, the exposed surface of the coplanar waveguide, and the exposed surface of the compensation structure comprises:

sequentially forming a first material layer and a second material layer on the exposed surface of the substrate, the exposed surface of the coplanar waveguide, and the exposed surface of the compensation structure, wherein an etching rate of a predetermined etchant for the first material layer is greater than an etching rate of the predetermined etchant for the second material layer; and wherein etching to remove the part of the predetermined structure comprises:

forming the first material layer and the second material layer by electron beam exposure, and removing part of exposed first material layer and part of the second material layer using the predetermined etchant to form the predetermined through hole.

25. The method of clause 24, wherein the first material layer is a polymethyl methacrylate (PMMA) layer having a thickness between 1 µm and 3 and the second material layer is a PEGI layer having a thickness between 300 nm and 800 nm or a methyl methacrylate (MMA) layer having a thickness between 300 nm and 800 nm.

26. The method of clause 21, wherein forming the air bridge on the exposed surface of the sacrificial structure and the partially-exposed surfaces of the first ground wire and the second ground wire comprises:

disposing photoresist parts, wherein a photoresist part is on each of the first ground wire and the second ground wire on both sides of the sacrificial structure, wherein a gap exists between each photoresist part and the sacrificial structure;

disposing an air bridge material on exposed surfaces of the photoresist parts, the partially-exposed surfaces of the first ground wire and the second ground wire, and the exposed surface of the sacrificial structure; and removing the photoresist parts and the air bridge material on the exposed surfaces of the photoresist parts, and forming the air bridge with the air bridge material on the exposed surface of the sacrificial structure and the air bridge material on the exposed surfaces of the first ground wire and the second ground wire.

27. The method of clause 21, wherein a surface of the compensation structure is a curved surface, wherein the surface is not in contact with at least one of the substrate, the coplanar waveguide, or the air bridge.

28. The method of clause 21, wherein the exposed surface of the compensation structure is a curved surface.

29. The method of clause 28, wherein a cross-sectional shape of the exposed surface of the compensation structure in a predetermined direction is semi-elliptical or semi-circular, and the predetermined direction comprises a thickness direction of the packaging structure.

30. The method of clause 21, wherein a material of the sacrificial structure comprises silica.

31. The method of any of clauses 17-30, wherein a material of the compensation structure comprises a superconducting material.

32. A quantum processor comprising the packaging structure of any of clauses 1-16 or a packaging structure manufactured by the method of any of clauses 17-31.

It should be noted that the above examples are only intended to describe the technical solution of the present disclosure, not to limit it. Although the present disclosure has been described in detail with reference to the foregoing embodiments, those of ordinary skill in the art can appreciate that the technical solution in the foregoing embodiments can still be modified, or some of the technical features thereof can be equivalently substituted. Such modifications and substitutions do not make the essence of the corresponding technical solution depart from the spirit and scope of the technical solutions of the various embodiments of the present disclosure.

The invention claimed is:

1. A waveguide, comprising:
   a substrate;
   a first ground wire;
   a second ground wire;
   a signal wire; and
   a compensation structure,
   wherein:
      the first ground wire, the second ground wire, and the signal wire are disposed on the substrate at intervals, and the signal wire is located between the first ground wire and the second ground wire;
      the compensation structure is configured to contact at least one of the substrate, the first ground wire, the second ground wire, or the signal wire; and
      the compensation structure comprises a first superconducting material.

2. The waveguide of claim 1, wherein the compensation structure comprises at least one of aluminum (Al), niobium (Nb), tantalum (Ta), aluminum nitride (AlN), or titanium nitride (TiN).

3. The waveguide of claim 1, wherein at least one of the first ground wire, the second ground wire, or the signal wire comprises a second superconducting material.

4. The waveguide of claim 3, wherein the second superconducting material is different from the first superconducting material.

5. The waveguide of claim 1, wherein the compensation structure is shaped as a cube, a hemisphere, a half cylinder, an ellipsoid, a cylinder, a prism, or a polyhedron.

6. The waveguide of claim 1, wherein the compensation structure contacts a surface of the substrate.

7. The waveguide of claim 1, wherein the compensation structure contacts a surface of the first ground wire.

8. The waveguide of claim 1, wherein the compensation structure contacts a surface of the second ground wire.

9. The waveguide of claim 1, wherein the compensation structure contacts a surface of the signal wire.

10. The waveguide of claim 1, wherein the compensation structure:
   is located between the signal wire and one of the first ground wire or the second ground wire, and
   does not contact the first ground wire, the second ground wire, or the signal wire.

11. The waveguide of claim 1, wherein the compensation structure:
   contacts a side wall of one of the first ground wire or the second ground wire, and
   is not located between the signal wire and one of the first ground wire or the second ground wire.

12. The waveguide of claim 1, wherein the compensation structure comprises:
   a first surface in contact with the substrate, and
   a second surface in contact with at least one of the first ground wire, the second ground wire, or the signal wire.

13. The waveguide of claim 1, wherein the compensation structure contacts:
   the signal wire, and
   one of the first ground wire or the second ground wire.

14. The waveguide of claim 1, wherein the compensation structure:
   contacts at least one of the first ground wire, the second ground wire, or the signal wire; and
   does not contact the substrate.

15. The waveguide of claim 1, wherein the compensation structure contacts at least one of:
   a side wall of the signal wire, or
   a side wall of one of the first ground wire or the second ground wire.

16. The waveguide of claim 1, wherein an exposed surface of the compensation structure is a curved surface.

17. The waveguide of claim 16, wherein the coplanar waveguide is disposed on the substrate along a predetermined direction, and a cross-sectional shape of the exposed surface of the compensation structure in the predetermined direction is semi-elliptical or semi-circular.

18. The waveguide of claim 1, wherein the compensation structure is a hollow structure.

19. A quantum processor, comprising:
   a substrate;
   a first ground wire;
   a second ground wire;
   a signal wire; and
   a compensation structure,
   wherein:
      the first ground wire, the second ground wire, and the signal wire are disposed on the substrate at intervals, and the signal wire is located between the first ground wire and the second ground wire;
      the compensation structure is configured to contact at least one of the substrate, the first ground wire, the second ground wire, or the signal wire; and
      the compensation structure comprises a first superconducting material.

20. A method of manufacturing a waveguide, comprising:
   providing a substrate; and
   forming a first ground wire, a second ground wire, a signal wire, and a compensation structure on the substrate,
   wherein:
      the first ground wire, the second ground wire, and the signal wire are disposed on the substrate at intervals, and the signal wire is located between the first ground wire and the second ground wire;
      the compensation structure contacts at least one of the substrate, the first ground wire, the second ground wire, or the signal wire; and
      the compensation structure comprises a superconducting material.

* * * * *